(12) United States Patent
Noguchi

(10) Patent No.: US 8,548,173 B2
(45) Date of Patent: Oct. 1, 2013

(54) SOUND VOLUME CORRECTING DEVICE, SOUND VOLUME CORRECTING METHOD, SOUND VOLUME CORRECTING PROGRAM, AND ELECTRONIC APPARATUS

(75) Inventor: Masayoshi Noguchi, Chiba (JP)

(73) Assignee: Sony Corporation, Tokyo (JP)

( * ) Notice: Subject to any disclaimer, the term of this patent is extended or adjusted under 35 U.S.C. 154(b) by 839 days.

(21) Appl. No.: 12/629,324

(22) Filed: Dec. 2, 2009

(65) Prior Publication Data

US 2010/0189270 A1    Jul. 29, 2010

(30) Foreign Application Priority Data

Dec. 4, 2008    (JP) ................ P2008-309704

(51) Int. Cl.
| | |
|---|---|
| *H04R 29/00* | (2006.01) |
| *H03G 3/00* | (2006.01) |
| *G10L 11/06* | (2006.01) |
| *G10L 19/14* | (2006.01) |

(52) U.S. Cl.
USPC ............. 381/56; 381/104; 381/107; 704/210; 704/225

(58) Field of Classification Search
USPC .................. 381/56, 107, 104, 110; 704/210, 704/225
See application file for complete search history.

(56) References Cited

U.S. PATENT DOCUMENTS

| | | | |
|---|---|---|---|
| 5,018,205 A | 5/1991 | Takagi et al. | |
| 6,249,757 B1 | 6/2001 | Cason | |
| 6,870,933 B2 | 3/2005 | Roovers | |
| 2004/0213421 A1 | 10/2004 | Jacobs | |
| 2005/0232445 A1 | 10/2005 | Vaudrey et al. | |
| 2006/0159190 A1 | 7/2006 | Wu et al. | |
| 2008/0152155 A1 | 6/2008 | Avendano et al. | |
| 2008/0304673 A1* | 12/2008 | Otani ............................ | 381/57 |
| 2010/0142729 A1 | 6/2010 | Noguchi | |
| 2010/0208918 A1 | 8/2010 | Noguchi | |

FOREIGN PATENT DOCUMENTS

| | | |
|---|---|---|
| CN | 1507293 A | 6/2004 |
| EP | 0 624 030 A1 | 11/1994 |
| JP | 63-193604 A | 8/1988 |
| JP | 01-311709 A | 12/1989 |
| JP | 03-009700 A | 1/1991 |
| JP | 04-303900 A | 10/1992 |
| JP | 5-23700 U | 3/1993 |
| JP | 08-009498 A | 1/1996 |
| JP | 08-222979 A | 8/1996 |
| JP | 08-292787 A | 11/1996 |
| JP | 2002-101002 A | 4/2002 |
| JP | 3321820 | 6/2002 |
| JP | 2003-084790 A | 3/2003 |
| JP | 2003-524906 T | 8/2003 |
| JP | 3475476 B2 | 9/2003 |

(Continued)

*Primary Examiner* — Vivian Chin
*Assistant Examiner* — Douglas Suthers
(74) *Attorney, Agent, or Firm* — Wolf, Greenfield & Sacks, P.C.

(57) ABSTRACT

A sound volume correcting device includes: a variable gain unit controlling a gain of an input audio signal on the basis of a gain control signal; a voice average level detector detecting an average level of a human voice signal in the input audio signal; and a gain control signal generator generating the gain control signal for controlling the gain of the input audio signal using the average level of the human voice signal detected by the voice average level detector as a reference level and supplying the generated gain control signal to the variable gain unit.

8 Claims, 21 Drawing Sheets

(56) References Cited

FOREIGN PATENT DOCUMENTS

| | | |
|---|---|---|
| JP | 2004-129187 A | 4/2004 |
| JP | 2005-229544 A | 8/2005 |
| JP | 2006-171663 A | 6/2006 |
| JP | 2006-524475 T | 10/2006 |
| JP | 2007-129383 A | 5/2007 |
| JP | 2007-158873 A | 6/2007 |
| JP | 2008-079065 A | 4/2008 |
| JP | 2008-309704 A | 12/2008 |
| JP | 2008-310901 A | 12/2008 |
| JP | 2009-025500 A | 2/2009 |
| WO | WO 96/29780 A1 | 9/1996 |
| WO | WO 99/53612 A1 | 10/1999 |
| WO | WO 2008/035227 A1 | 3/2008 |
| WO | WO 2008/059640 A1 | 5/2008 |
| WO | WO 2008/073487 A2 | 6/2008 |
| WO | WO 2008/078232 A1 | 7/2008 |

* cited by examiner

35

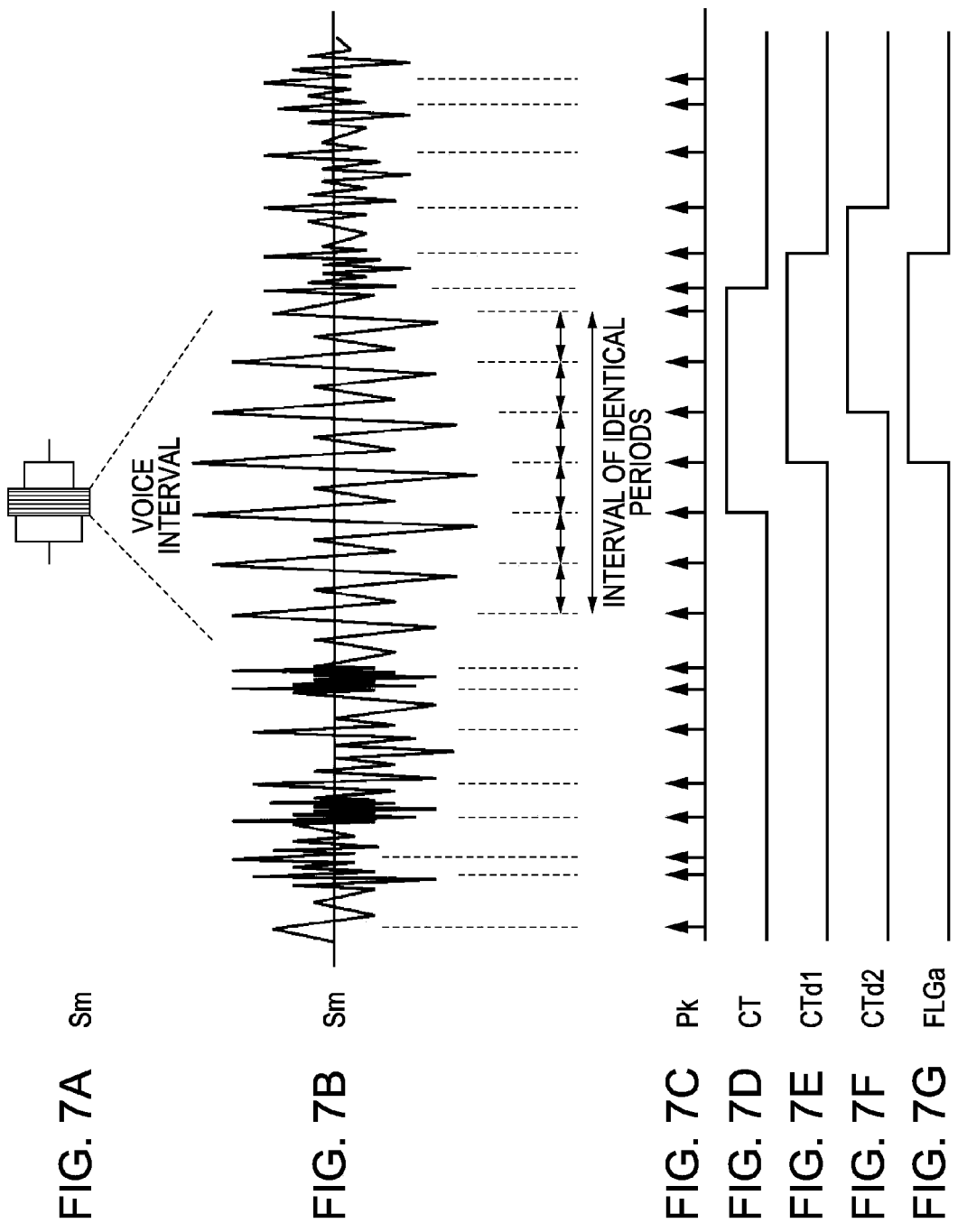

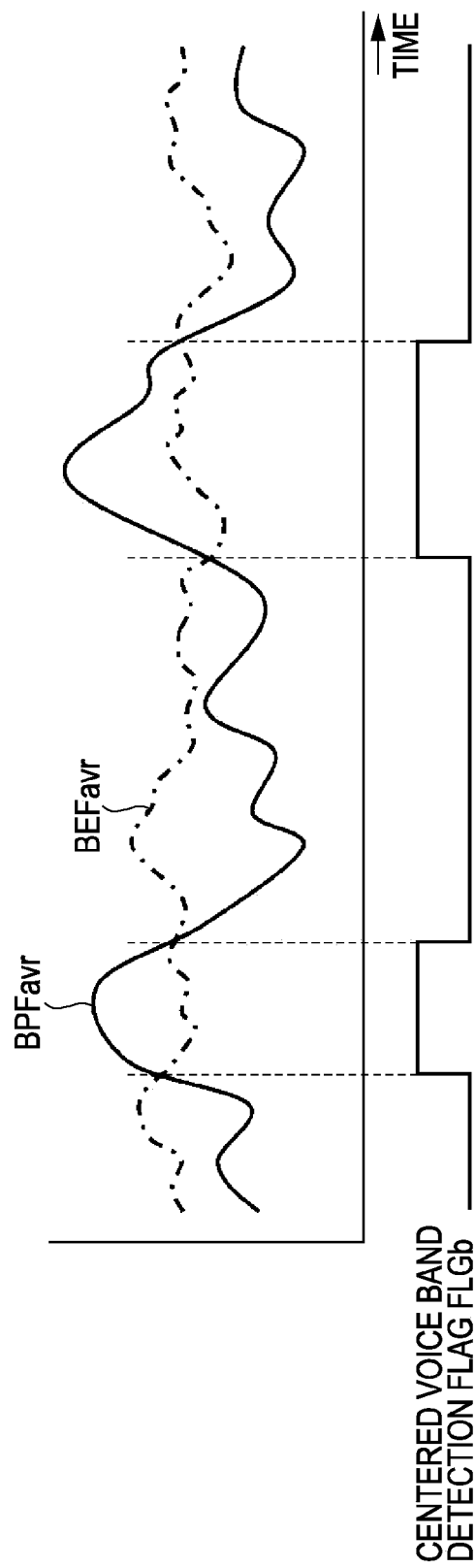

VOICE INTERVAL DETECTION FLAG FLG

SILENCE DETECTION FLAG SFLG

NON-VOICE INTERVAL DETECTION FLAG NFLG

SOUND VOLUME CORRECTING DEVICE, SOUND VOLUME CORRECTING METHOD, SOUND VOLUME CORRECTING PROGRAM, AND ELECTRONIC APPARATUS

BACKGROUND OF THE INVENTION

1. Field of the Invention

The present invention relates to a sound volume correcting device, a sound volume correcting method, and a sound volume correcting program, which can be suitably used in a sound output unit of an electronic apparatus such as a television broadcast receiver.

2. Description of the Related Art

When a broadcast channel received by a television broadcast receiver is switched or when plural input devices are switched in an AV center of an audio-visual (AV) system, an output sound volume may be greatly changed due to a level difference between contents.

In this case, it is necessary for a user to adjust the sound volume using a remote controller or the like so as to obtain his preferred sound volume and thus may find it troublesome.

Even with the same content (for example, on the same broadcast channel or during the same broadcast program), the output sound volume varies depending on a variation between commercial message (CM) breaks or scenes, thereby giving an unpleasant feeling.

Various sound volume correcting techniques have been suggested to solve the above-mentioned problem. A sound volume control method using an AGC (Auto Gain Control) is widely known as an example thereof.

FIG. 26 is a block diagram illustrating the configuration of a sound volume corrector using the AGC. In the example shown in FIG. 26, left and right channel input audio signals SiL and SiR are corrected in sound volume.

In this example, the left and right channel input audio signals SiL and SiR are supplied to variation gain amplifiers 1L and 1R of which the gains are variably controlled on the basis of a gain control signal.

The left and right channel input audio signals SiL and SiR are added to each other by an adder 2. The added output signal from the adder 2 is made to be half the gain by an amplifier 3 and is then supplied to an average level detector 4, and the average level of the added output signal is detected by the average level detector 4.

The average level detected by the average level detector 4 is supplied to a gain control signal generator 5. The gain control signal generator 5 compares the average level from the average level detector 4 with a predetermined reference level, generates a gain control signal so that the difference between both levels is zero using the comparison result, and supplies the generated gain control signal to the variable gain amplifiers 1L and 1R.

In the variable gain amplifiers 1L and 1R, the gain is variably controlled on the basis of the gain control signal from the gain control signal generator 5. In this case, the gains of the left and right channel input audio signals SiL and SiR are controlled by the variable gain amplifiers 1L and 1R so that the average level of the added output signal from the adder 2 is equal to the reference level.

As a result, left and right channel output audio signals SoL and SoR obtained from the variable gain amplifiers 1L and 1R are automatically corrected to a constant level of sound volume by adjusting a small sound to be great and a great sound to be small.

Various sound volume correcting methods have been suggested in addition to the sound volume correcting method using the AGC. For example, Japanese Patent No. 3321820 discloses a method of controlling a sound volume within a constant range by controlling a compressor to adjust an output sound level to be smaller than an input sound level when a great level of sound is input.

SUMMARY OF THE INVENTION

However, for example, in a television broadcast or movie contents recorded on a recording medium, various types of sounds such as human voice, BGM (Background Music), and sound effect are included in the audio signals thereof. When a user manually controls the volume using a remote controller, the level of volume is often adjusted so as to allow speech to properly be audible using the level of the human voice in the audio signals as a reference.

The above-mentioned sound volume correcting method is a method of making a control of the sound volume by monitoring the level of the entire audio signals. For example, in the AGC method, when the control of the sound volume (gain control) is made using the average level of the entire audio signals as a reference, the control of the sound volume is made for all the audio signals, whereby a loud sound can be made to be inaudible or a small sound can be made to be audible.

However, acknowledging the range of the human voice, the human voice is not kept at a constant level and in the past sound volume correcting method, it may not be said that speech is easy to hear.

It is desirable to provide a sound volume correcting device and a sound volume correcting method for making the human voice such as speech audible.

According to an embodiment of the invention, there is provided a sound volume correcting device including: variable gain means for controlling a gain of an input audio signal on the basis of a gain control signal; voice average level detecting means for detecting an average level of a human voice signal in the input audio signal; and gain control signal generating means for generating the gain control signal for controlling the gain of the input audio signal using the average level of the human voice signal detected by the voice average level detecting means as a reference level and supplying the generated gain control signal to the variable gain means.

According to this configuration, the gain of the input audio signal is controlled by the variable gain means using the average level of the human voice signal of the input audio signal as a reference level. Therefore, human voices included in the input audio signal is kept at a constant level and thus give an audible sound volume.

According to another embodiment of the invention, there is provided a sound volume correcting device including: variable gain means for controlling a gain of an input audio signal on the basis of a gain control signal; voice average level detecting means for detecting an average level of a human voice signal in the input audio signal; non-voice average level detecting means for detecting an average level of a non-voice and non-silence audio signal in the input audio signal; and gain control signal generating means for generating the gain control signal for controlling the gain of the input audio signal using the voice average level detected by the voice average level detecting means as a reference level when the non-voice average level detected by the non-voice average level detecting means is not greater than the voice average level detected by the voice average level detecting means by a predetermined amount, generating the gain control signal for controlling the gain of the input audio signal using the non-voice average level detected by the non-voice average level detecting means as a reference level when the non-voice average level detected by the non-voice average level detecting means is greater than the voice average level detected by the voice average level detecting means by the predetermined amount, and supplying the generated gain control signal to the variable gain means.

According to this configuration, the gain control signal generating means employs different gain control signal generating methods depending on whether the non-voice average level detected by the non-voice average level detecting means is greater than the voice average level detected by the voice average level detecting means by a reference amount.

That is, when the non-voice average level is not greater than the voice average level by a predetermined amount, the gain control signal generating means generates the gain control signal for controlling the gain of the input audio signal using the voice average level as a reference level. When the non-voice average level is greater than the voice average level by the predetermined amount, the gain control signal generating means generates the gain control signal for controlling the gain of the input audio signal using the non-voice average level as a reference level.

Accordingly, according to the above-mentioned embodiment, when the non-voice average level is not greater than the voice average level by a predetermined amount, the gain of the input audio signal is controlled by the variable gain means using the average level of the human voice signal in the input audio signal as a reference level. Therefore, the human voice such as speech included in the input audio signal is kept at a constant level and thus give an audible sound volume.

When the non-voice average level is greater than the voice average level by a predetermined amount, the gain of the input audio signal is controlled by the variable gain means using the average level of the non-human voice signal in the input audio signal as a reference level. Therefore, when the level of the non-human voice signal is greater than the level of the human voice signal in the input audio signal by a predetermined amount, it is possible to prevent the level of the non-human voice signal from being further raised by the control using the voice average level as a reference level. At this time, since the average level of the non-human voice signal is controlled at a constant level, it is possible to obtain an audible sound volume.

According to the above-mentioned configuration, the gain of the input audio signal is controlled by the variable gain means using the average level of the human voice signal in the input audio signal as a reference level. Therefore, even when the level of the human voice such as speech included in the input audio signal varies, the level of the human voice is automatically controlled to a constant level and thus the reproduced sound has an audible sound volume.

According to the above-mentioned configuration, when the level of the non-human voice signal is greater than the level of the human voice signal in the input audio signal by a predetermined amount, the level of the non-human voice signal is automatically controlled to a constant level and thus the reproduced sound has an audible sound volume.

BRIEF DESCRIPTION OF THE DRAWINGS

FIGS. 7A to 7G are waveform diagrams illustrating the configuration shown in FIG. 6.

FIG. 9 is a diagram illustrating another partial operation of the partial configuration of the voice interval detector shown in FIG. 5.

DESCRIPTION OF THE PREFERRED EMBODIMENTS

Hereinafter, a sound volume correcting device according to preferred embodiments of the invention will be described with reference to the accompanying drawings. In the embodiments, a sound volume correcting device is used as an audio output unit of a television broadcast receiver.

Figure 2:
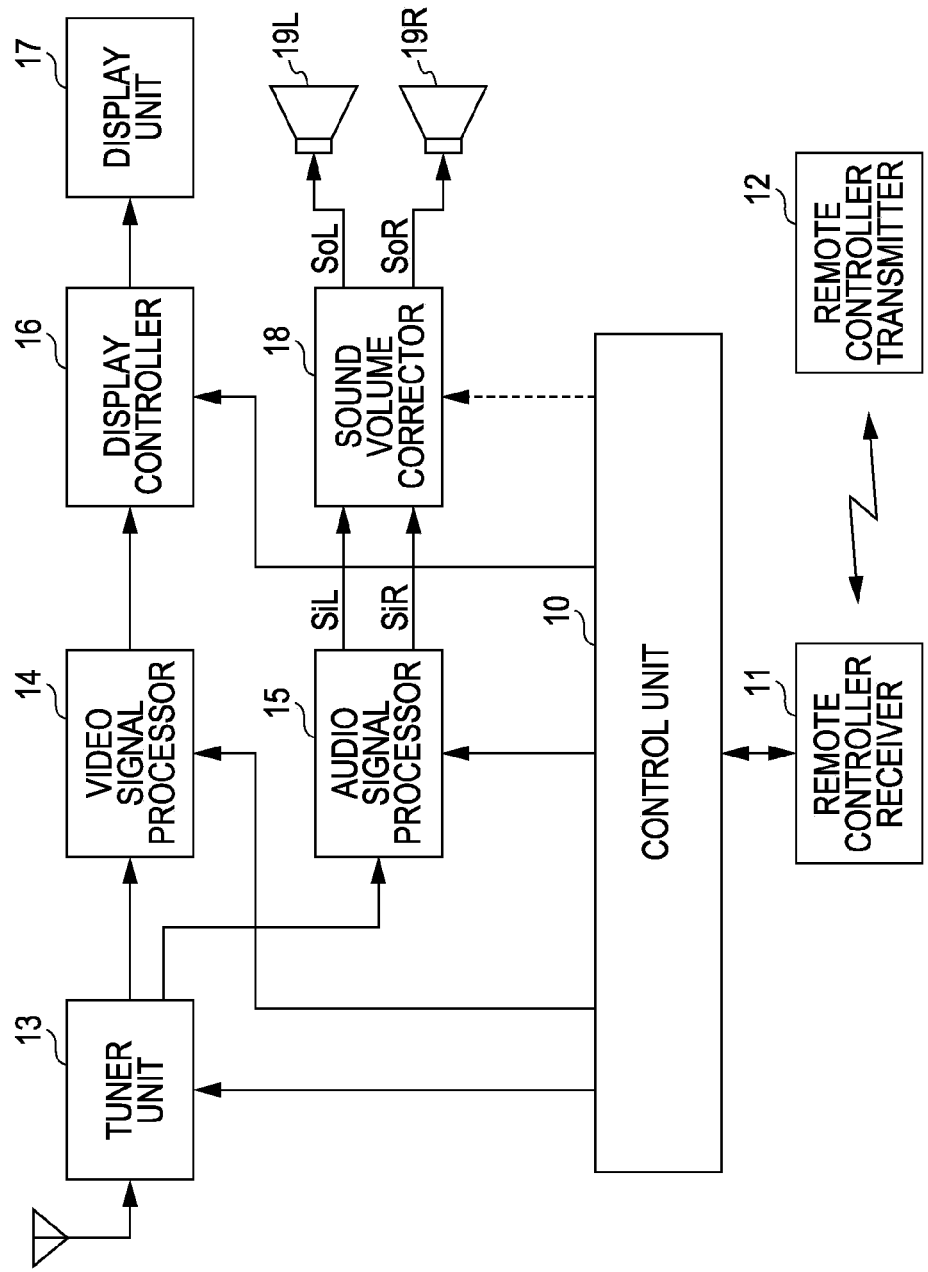
FIG. 2 is a block diagram illustrating an example of an electronic apparatus employing the sound volume correcting device according to the first embodiment of the invention.

That is, FIG. 2 is a block diagram illustrating the configuration of a television broadcast receiver. The television broadcast receiver shown in FIG. 2 includes a control unit 10 including a micro computer. A remote controller receive 11 is connected to the control unit 10. The remote controller receive 11 receives a remote controller signal from a remote controller transmitter 12 and supplies the received remote controller signal to the control unit 10. The control unit 10 makes a control of processes corresponding to the received remote controller signal.

The control unit 10 supplies control signals to the constituent units of the television broadcast receiver and performs processes of receiving a television broadcast signal, reproducing a video thereof, and reproducing an audio.

The tuner unit 13 selects and extracts a signal of a broadcast channel, which is specified by a channel selection control signal corresponding to a user's operating a remote controller and supplied from the control unit 10, from the television broadcast signals. The tuner unit 13 demodulates and decodes a video signal and an audio signal from the selected and extracted signal of the broadcast channel, supplies the video signal to a video signal processor 14, and supplies the audio signal to an audio signal processor 15.

The video signal processor 14 performs a predetermined process on the video signal under the control of the control unit 10 and supplies the processed video signal to a display unit 17 including, for example, an LCD (Liquid Crystal Display) via a display controller 16. Accordingly, an image of a broadcast program of the selected broadcast channel is displayed on the display unit 17.

The audio signal processor 15 performs a predetermined process on the audio signal under the control of the control unit 10. In this embodiment, the audio signal processor 15 generates left and right channel input audio signals SiL and SiR from the audio signal from the tuner unit 13 and supplies the processed audio signals SiL and SiR to a sound volume corrector 18.

The sound volume corrector 18 is a unit to which the sound volume correcting device according to this embodiment is applied. The input audio signals SiL and SiR are corrected in sound volume as described later and are output as output audio signals SoL and SoR. The output audio signals SoL and SoR from the sound volume corrector 18 are supplied to speakers 19L and 19R and are reproduced as sounds. Accordingly, the sounds of the broadcast program of the selected broadcast channel are output from the speakers 19L and 19R.

The sound volume correcting device according to this embodiment will be described now as the sound volume corrector 18.

Sound Volume Correcting Device according to First Embodiment

Figure 1:
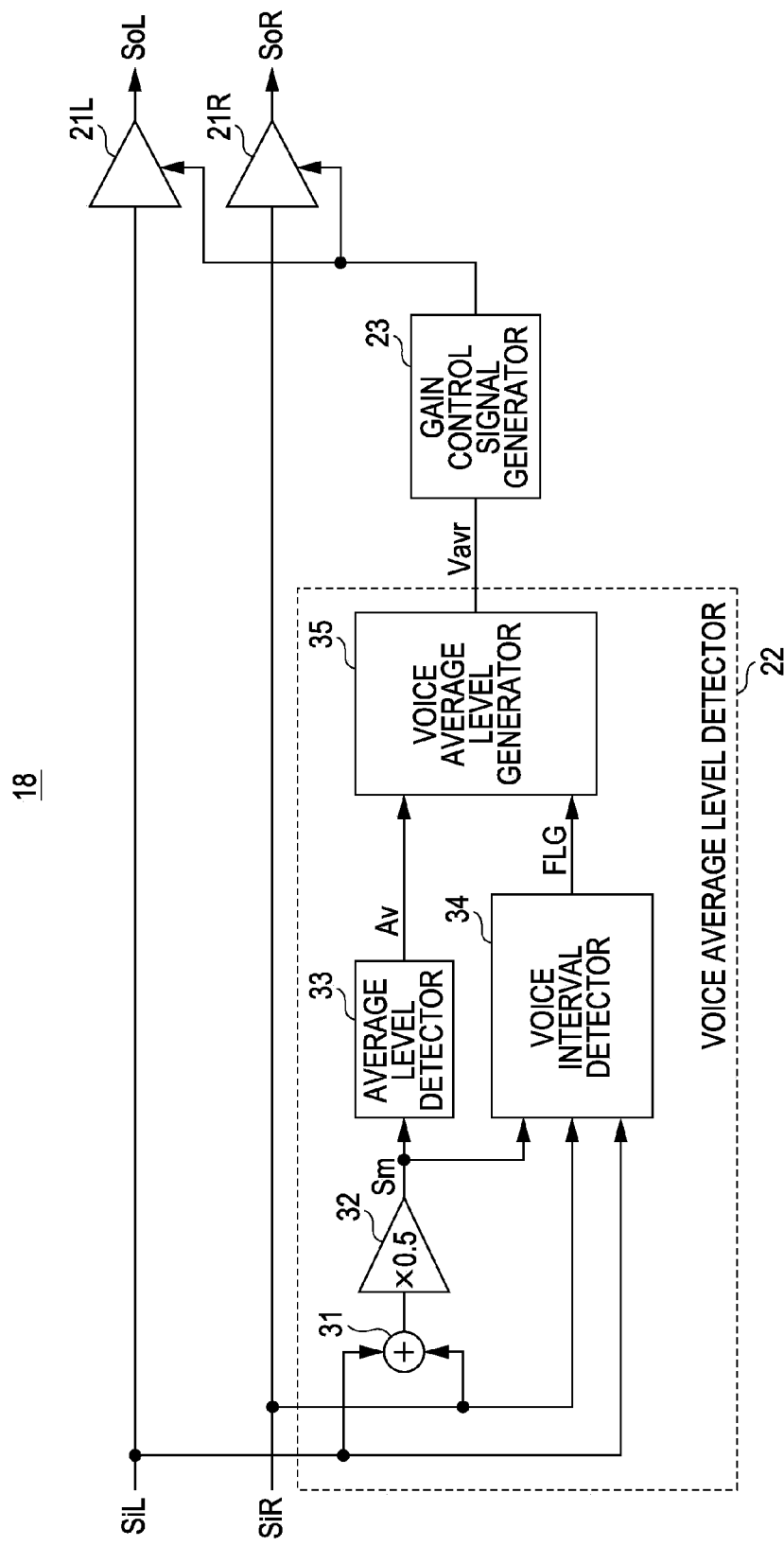
FIG. 1 is a block diagram illustrating a sound volume correcting device according to a first embodiment of the invention.

FIG. 1 is a block diagram illustrating the entire configuration of the sound volume corrector 18 as the sound volume correcting device according to a first embodiment of the invention.

As shown in FIG. 1, in this embodiment, the left and right channel input audio signals SiL and SiR are supplied to variable gain amplifiers 21L and 21R in which the gain is controlled on the basis of a gain control signal.

The left and right channel input audio signals SiL and SiR are supplied to a voice average level detector 22, whereby an average level of a voice signal (voice average level) in the added signal of the left and right channel input audio signals SiL and SiR is detected, as described later.

The voice average level detected by the voice average level detector 22 is supplied to a gain control signal generator 23. The gain control signal generator 23 compares the voice average level with a predetermined reference level, generates the gain control signal for making the difference between both levels zero using the comparison result, and supplies the generated gain control signal to the variable gain amplifiers 21L and 21R.

The gain of the variable gain amplifiers 21L and 21R is variably controlled on the basis of the gain control signal from the gain control signal generator 23. In this case, the gain of the left and right channel input audio signals SiL and SiR is controlled by the variable gain amplifiers 21L and 21R so that the voice average level of the added signal of the left and right channel input audio signals SiL and SiR is equal to the reference level.

In this way, the variable gain amplifiers 21L and 21R automatically correct the sound volume using the average level of the human voice as a reference. Accordingly, when the left and right channel output audio signals SoL and SoR acquired from the variable gain amplifiers 21L and 21R are reproduced as sound by speakers 19L and 19R, the sound volume level of the human voice such as speech in the reproduced sound is kept at a constant level and the human voice is audible.

In this embodiment, the voice average level detector 22 has the following configuration.

The left and right channel input audio signals SiL and SiR are added to each other by an adder 31. The added output signal from the adder 31 is made to be half the gain by an amplifier 32. The added output signal Sm from the amplifier 32 is supplied to an average level detector 33, the average level of the added output signal Sm is detected by the average level detector 33, and a signal with the average level (referred to as "average level signal") Av is output. The average level signal Av of the added output signal Sm detected by the average level detector 33 is supplied to a voice average level generator 35.

The added output signal Sm from the amplifier 32 is supplied to a voice interval detector 34 and the left and right channel input audio signals SiL and SiR are also supplied to the voice interval detector 34.

As described later, the voice interval detector 34 detects a voice interval which is a time interval including a human voice signal in the added output signal Sm from the amplifier 32. The voice interval detector 34 also detects a voice interval which is a time interval including the human voice signal from the left and right channel input audio signals SiL and SiR.

In this embodiment, the voice interval detector 34 detects the voice interval using feature quantities of voice signals. Plural types of feature quantities of the voice signals exist. The voice interval detector 34 of this embodiment detects the voice interval on the basis of the plural types of feature quantities of the voice signal, as described later, and takes a logical product of the detection results, whereby the precision of the detected voice interval is enhanced. The voice interval detector 34 generates a voice interval detection flag FLG indicating the detected voice interval and outputs the generated voice interval detection flag. The voice interval detector 34 supplies the voice interval detection flag FLG to a voice average level generator 35.

Configuration of Voice Average Level Generator

Figure 3:
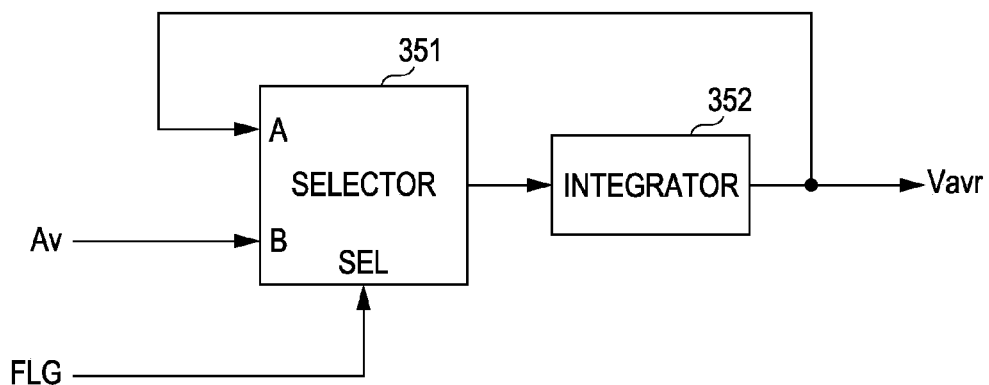
FIG. 3 is a block diagram illustrating a configuration of a voice average level generator according to the first embodiment shown in FIG. 1.

In this embodiment, the voice average level generator 35 has the same configuration as shown in FIG. 3.

That is, the average level Av from the average level detector 33 is supplied to an input terminal of a selector 351 and the voice interval detection flag FLG is supplied as a selection signal to the selector 351. The output signal of the selector 351 is supplied to an integrator 352. The output signal of the integrator 352 is supplied to the other input terminal of the selector 351 and is output as an output signal Vavr of the voice average level generator 35.

The selector 351 selects and supplies the average level signal Av from the average level detector 33 to the integrator 352 on the basis of the voice interval detection flag FLG in a voice interval, and selects and supplies the output signal of the integrator 352 to the integrator 352 in a non-voice interval.

Accordingly, the integrator 352 integrates the average level signal Av from the average level detector 33 to generate an average signal in the voice interval. The integrator 352 holds the output level signal of the integrator 352 in the non-voice interval.

Figure 4:
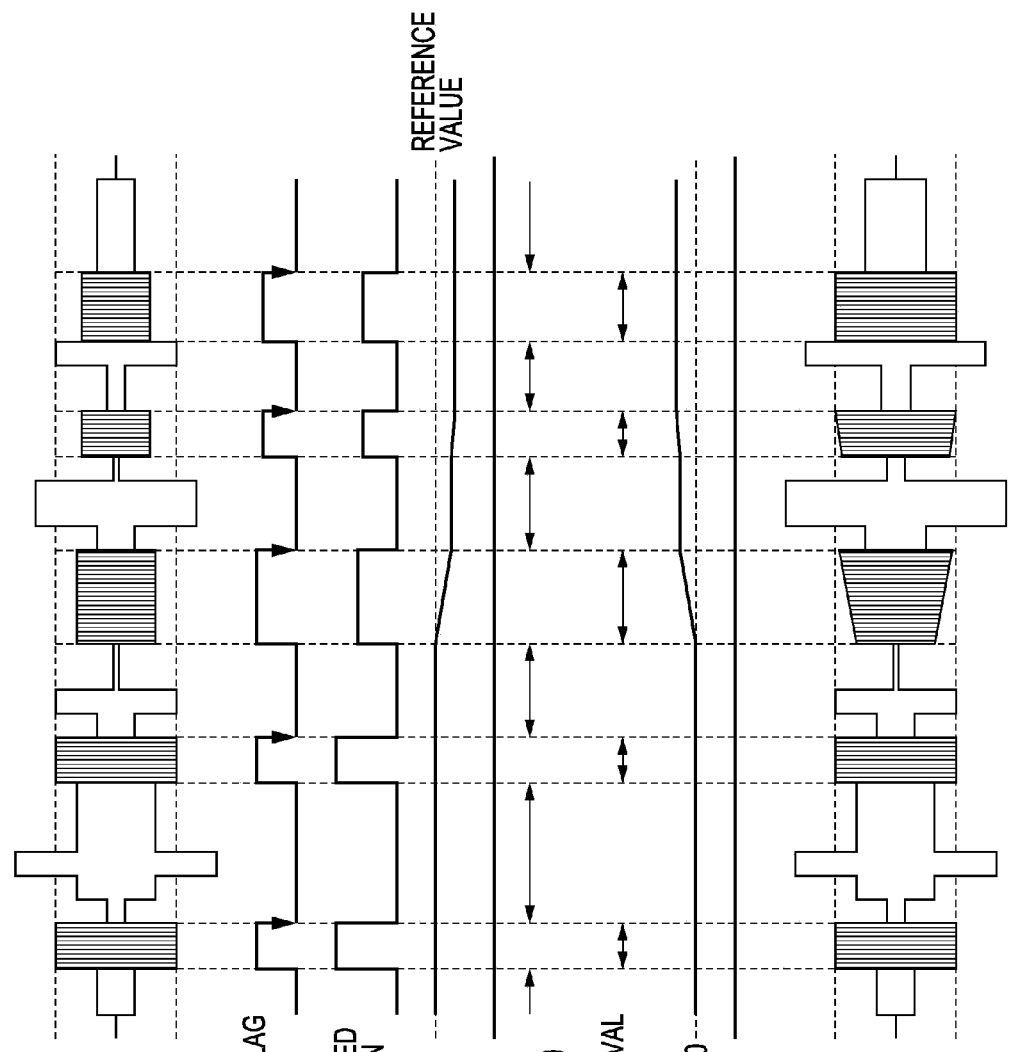
FIGS. 4A to 4H are waveform diagrams illustrating an operation of the voice average level generator shown in FIG. 3.

For example, it is considered that the added output signal Sm from the amplifier 32 is the same as shown in FIG. 4A. In the added output signal Sm shown in FIG. 4A, the interval occupied by vertical bars is an interval including predominantly a human voice or including only a human voice and the voice interval detection flag FLG of the voice interval detector 34 is the same as shown in FIG. 4B.

Therefore, the selector 351 selects only the signal of the voice interval in the average level signal Av from the average level detector 33 on the basis of the voice interval detection flag FLG, which is the same as shown in FIG. 4C.

The integrator 352 integrates the signal level of the voice interval in the average level signal Av from the average level detector 33 using the previous output (holding value) of the integrator 352 as an initial value in the voice interval. In the non-voice interval, since the selector 351 selects the output signal Vavr of the integrator 352, the integrator 352 holds the signal level at the final time of the voice interval. As a result, the output signal Vavr of the integrator 352, that is, the output signal Vavr of the voice average level generator 35, is the same as shown in FIG. 4D.

Then, as shown in FIG. 4F, the integrator 352 performs an integrating operation using the previous output (holding value) of the integrator 352 as an initial value to calculate the average of the voice signal level in the voice interval indicated by the voice interval detection flag FLG.

As shown in FIG. 4E, the integrator 352 holds the signal level at the final time of the voice interval in the interval other than the voice interval.

The acquired output signal Vavr of the voice average level generator 35 indicates the average level of the voice signal and is supplied as the output signal of the voice average level detector 22 to the gain control signal generator 23.

The gain control signal generator 23 compares the voice average level signal Vavr from the voice average level detector 22 with a predetermined reference level and generates a gain control signal so that the difference between both levels is zero on the basis of the comparison result.

The gain control signal generated by the gain control signal generator 23 is supplied to variable gain amplifiers 21L and 21R. In the variable gain amplifiers 21L and 21R, the gain is controlled so that the voice average level of the input audio signals SiL and SiR becomes the reference level on the basis of the gain control signal.

In the example shown in FIGS. 4A to 4H, since the voice average level signal Vavr is the same as shown in FIG. 4D, the voice average level of the input audio signals SiL and SiR is controlled to be a reference level on the basis of the level correction gain shown in FIG. 4G.

As a result, the output audio signals SoL and SoR from the variable gain amplifiers 21L and 21R are controlled in gain as shown in FIG. 4H.

Configuration of Voice Interval Detector

As described above, the voice interval detector 34 detects the voice interval which is a time interval including human voice from the input audio signal Sm, paying attention to the feature quantities of the voice signal. In this embodiment, paying attention to plural types of feature quantities of the voice signal, the voice interval detector 34 detects the voice interval using each of the plural types of feature quantities. By generating and outputting the voice interval detection flag FLG on the basis of the voice intervals of the plural detection results, it is possible to enhance the precision of the detected voice intervals.

Figure 5:
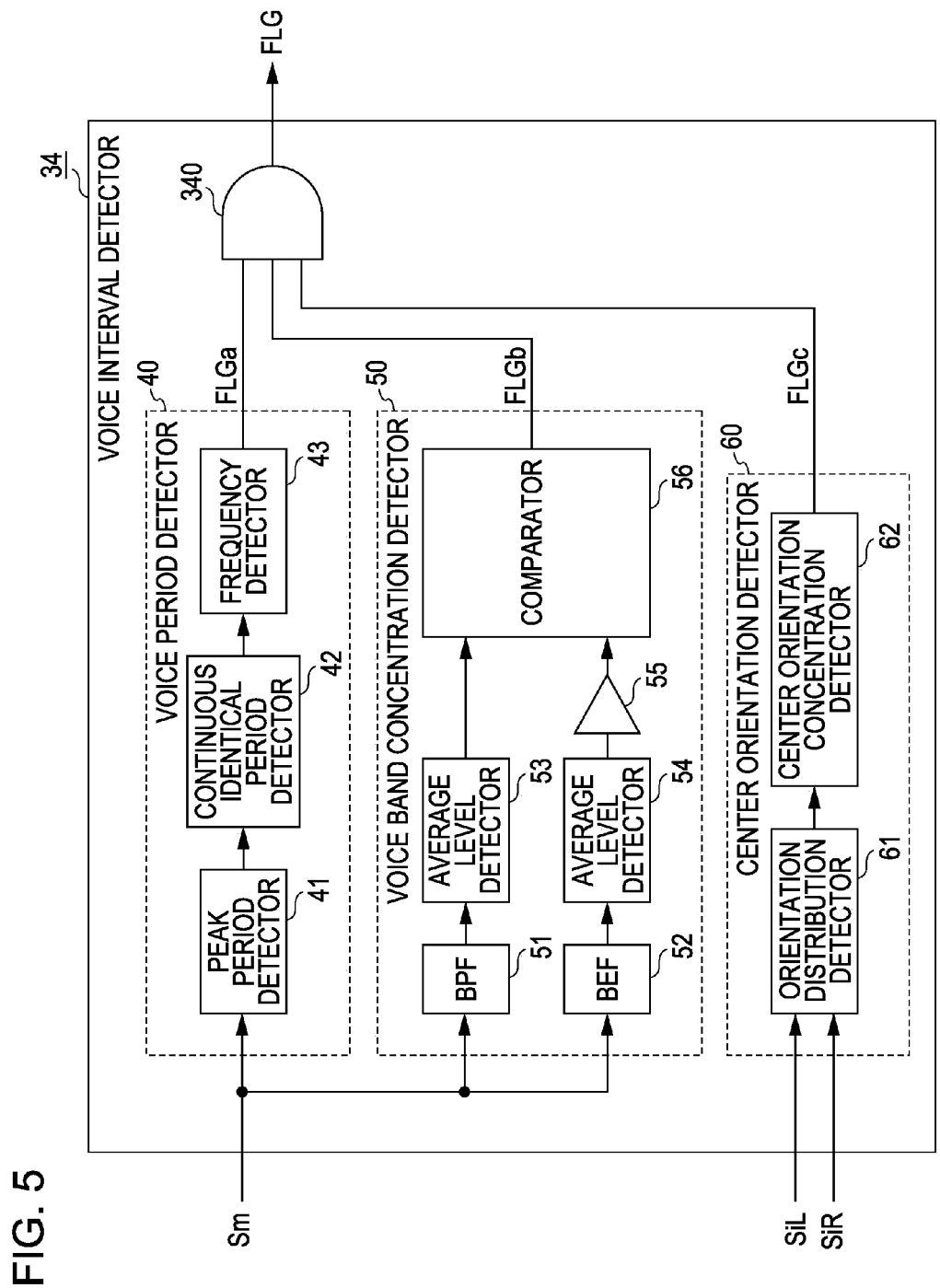
FIG. 5 is a block diagram illustrating a configuration of a voice interval detector according to the first embodiment shown in FIG. 1.

FIG. 5 is a block diagram illustrating the configuration of the voice interval detector 34 according to this embodiment.

In this embodiment, the voice interval detector 34 includes three detectors of a voice period detector 40, a voice band concentration detector 50, and a center orientation detector 60. The three detectors 40, 50, and 60 detect one feature quantity of the voice signal for specifying the voice interval. By taking the logical product of three detection outputs of the three detectors 40, 50, and 60, it is possible to enhance precision in detecting the voice interval. The three detectors 40, 50, and 60 will be described now.

Voice Period Detector

A voice signal includes plural distinctive frequency components and has a waveform characteristic that the peak of a basic frequency component called pitch is emphasized, which is continuous in a vowel period. The peak of the basic frequency component has a peak-shaped envelope every time a vowel occurs and is repeated for an identical period. Accordingly, by detecting the peak of the waveform of the input audio signal and detecting the period continuity of the detected peak, it is possible to simply specify the interval including a voice by a lower load process. That is, it is possible to detect the voice interval using the continuity of an identical peak period of the voice signal as a feature quantity for detecting the voice interval.

The peak period has a slope gradually increasing or decreasing and the difference between adjacent peak periods is small. Accordingly, by detecting the identity of the adjacent peak periods within a certain allowable error range, it is possible to detect the voice interval including the human voice while avoiding the influence of variation of the peak period.

In view of the above description, in this embodiment, the voice period detector 40 includes a peak period detector 41, a continuous identical period detector 42, and a frequency detector 43.

The peak period detector 41 detects the peak of the input audio signal Sm and detects the period of the detected peak.

The continuous identical period detector 42 determines the identity of the adjacent peak periods detected by the peak period detector 41 and detects that the identical peak period is continuous when it is determined that the adjacent peak periods are identical. In this case, the continuous identical period detector 42 determines the identity of the adjacent peak periods in the period range when the peak period is in the voice frequency band. For example, when the peak period is in the range of about 1 ms to 10 ms, the identity of the adjacent peak periods is determined.

The frequency detector 43 removes the influence due to the variation in peak period by preparing three or more outputs obtained by delaying the output of the continuous identical period detector 42 by one peak period and taking the majority of the plural outputs. That is, when the peak period varies, an interval corresponding to one to plural periods at the variation time should be detected as the voice interval with the continuous identical period by the continuous identical period detector 42, but may not be detected as the continuous identical period. The frequency detector 43 removes one to plural periods which are detected as being discontinuous due to the variation, whereby the detection output with a stable continuous identical period is obtained.

Figure 6:
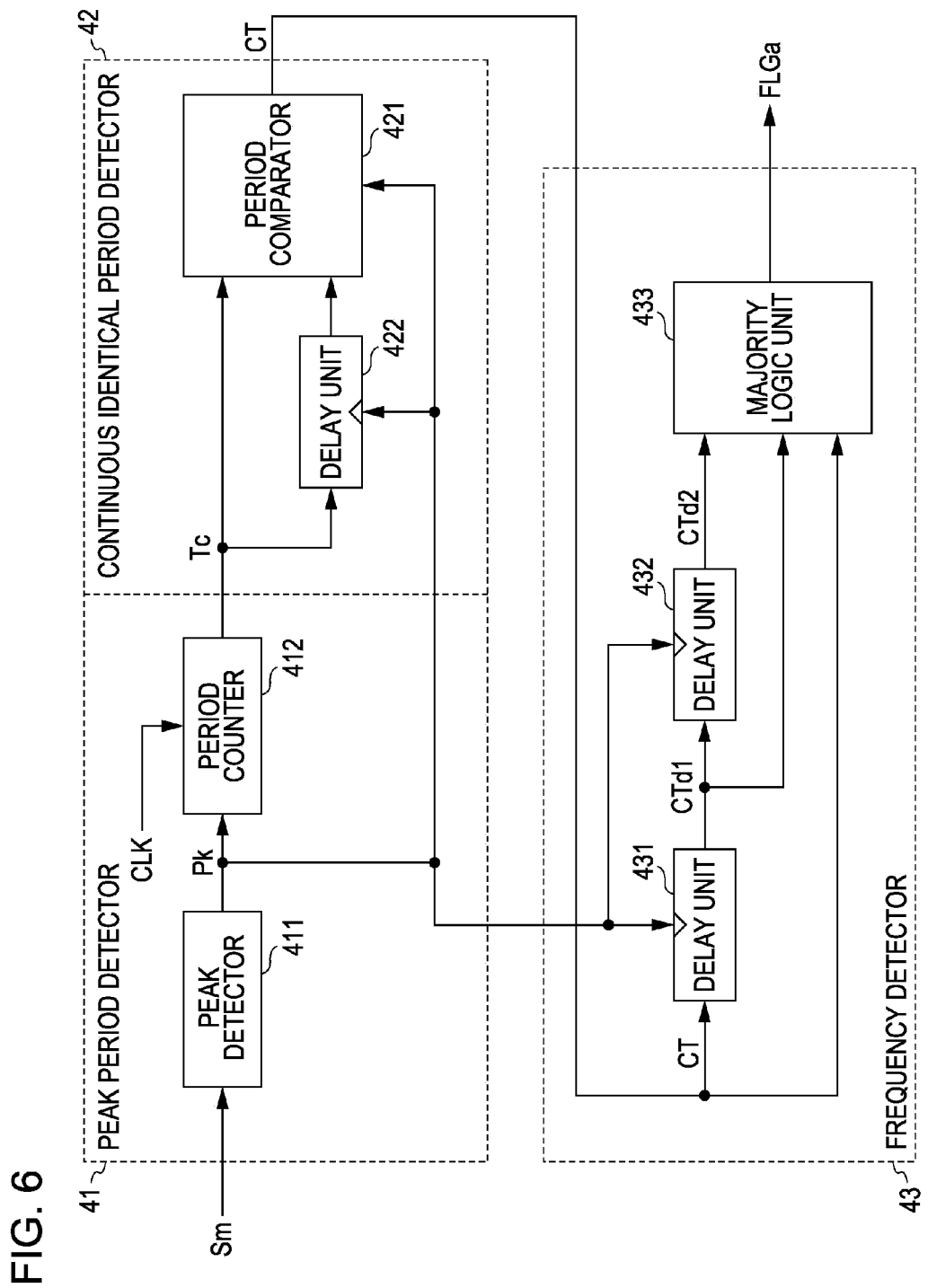
FIG. 6 is a block diagram illustrating a partial configuration of the voice interval detector shown in FIG. 5.

FIG. 6 is a diagram illustrating the detailed configuration of the voice period detector 40. The peak period detector 41 includes a peak detector 411 and a period counter 412. The continuous identical period detector 42 includes a period comparator 421 and a delay unit 422.

The frequency detector 43 includes two delay units 431 and 432 delaying the output signal of the continuous identical period detector 42 by one peak period and a majority logic unit 433.

The operation of the voice period detector 40 will be described with reference to the waveform diagrams of FIGS. 7A to 7G. That is, FIG. 7B shows the sound waveform of the voice interval in FIG. 7A showing a part of a combined audio signal Sm shown in FIG. 4A.

In this example, the peak detector 411 of the peak period detector 41 detects the positive peak position of the input audio signal Sm shown in FIG. 7A and outputs a peak detection output Pk indicating the detection time (detection position) (see FIG. 7C). The peak detector 411 detects the peak value greater than a predetermined threshold value as a peak position.

The peak detection output Pk from the peak detector 411 is supplied to the period counter 412. The period counter 412 is supplied with a clock CLK having a frequency much higher than the peak period of the voice signal and counts the peak period by counting the clock CLK between the adjacent peak detection outputs Pk. Accordingly, the period counter 412 outputs the count value of the clock CLK as the peak period.

The count value Tc as the peak period detection output from the period counter 412 is supplied to the continuous identical period detector 42.

In the continuous identical period detector 42, the count value Tc as the peak period detection output from the period counter 412 is supplied to the period comparator 421 without any delay and is also supplied to the period comparator 412 with a delay by the delay unit 422.

The delay unit 422 includes a latch unit supplied as a clock with the peak detection output Pk, delays the count value Tc from the period counter 412 by one peak period, and then supplies the delayed count value to the period comparator 421.

In this example, the period comparator 421 checks whether the count value Tc from the period counter 412 is a count value corresponding to the peak period of 1 ms to 10 ms. When it is determined that the count value Tc is not the count value corresponding to the peak period of 1 ms to 10 ms, the period comparator 421 does not compare the periods and sets the output CT thereof to a low level ("0") in this example. When it is determined that the count value Tc is the count value corresponding to the peak period of 1 ms to 10 ms, the period comparator 421 compares the adjacent peak periods with each other as follows.

That is, the period comparator 421 determines whether the count value Tcp of the peak period at the present time from the period counter 412 is identical to the count value Tcb of the peak period at the previous time by one peak period by comparing both peak periods. Here, the period comparator 421 determines that both peak periods are identical when both count values are in a small allowable range in which both can be considered as being identical as well as the count values Tcp and Tcb of the previous and subsequent peak periods. The magnitude of the difference to be determined as being identical is set in advance depending on the allowable precision with which the voice interval is detected.

In this example, the period comparator 421 outputs a continuous identical period detection flag CT (see FIG. 7D) which is set to a high level ("1") when the count values Tcp and Tcb of the previous and subsequent peak periods are identical and which is set to a low level ("0") when both count values are not identical.

The continuous identical period detection flag CT is supplied to the frequency detector 43. The frequency detector 43 includes two delay units 431 and 432 and a majority logic unit 433 in this example as described above.

The delay units 431 and 432 includes a latch unit to which the peak detection output Pk is supplied as a clock in this example and delays the input signal thereof by one peak period.

The delay unit 431 receives the continuous identical period detection flag CT from the continuous identical period detector 42 as an input signal and outputs a signal CRd1 (see FIG. 7E) obtained by delaying the continuous identical period detection flag CT by one peak period.

The delay unit 432 receives the output signal CTd1 of the delay unit 431 and outputs a signal CTd2 (see FIG. 7F) obtained by delaying the output signal CTd1 by one peak period.

Three signals of the continuous identical period detection flag CT, the one-peak-period delayed signal CTd1, and the two-peak-period delayed signal CTd2 are supplied to the majority logic unit 433.

The majority logic unit 433 generates and outputs a voice period detection flag FLGa (see FIG. 7G) which is set to "1" when two signals of the three signals CT, CTd1, and CTd2 are at the high level of "1" and which is set to a low level of "0" otherwise.

Even when the continuous identical period detector 42 may not detect some peak period intervals of the voice intervals as the continuous identical period interval due to the variation in peak period, the frequency detector 43 can output the voice period detection flag FLGa including some peak intervals.

In this way, the voice period detection flag FLGa detected by the voice period detector 40 is supplied to an AND gate 340.

In the above-mentioned example, the frequency detector 43 takes the majority of three signals different from each other by one peak period using two delay units, but the frequency detector 43 may take the majority using three or more delay units. In this case, the majority is a simple majority, but may be a majority greater than a predetermined threshold value. For example, it is considered that the majority of five signals different from each other by one peak period are taken using four delay units. Instead of setting the voice interval detection signal FLGa to "1" when three or more signals are "1", the voice interval detection signal FLGa may be set to "1" only when four or more signals are "1".

In the above-mentioned example, the voice period detector 40 detects the positive peak of the sound waveform, but the negative peak may be detected. Both the positive and negative peaks may be detected and the logical sum thereof may be used.

Voice Band Concentration Detector

The frequency band of a main component of vowels of voice signals is often included in a middle frequency band of 100 Hz to 1 kHz. Accordingly, by extracting a position where the signal component of the frequency band of 100 Hz to 1 kHz is greater than other components, it is possible to specify the interval where a human voice exists. That is, it is possible to detect the voice interval using the frequency band of the main component of the vowels of the voice signals as a feature quantity for detecting the voice interval.

Signals having much frequency band components such as background noise or explosion sound different from human voice can be excluded. In this embodiment, a vowel frequency band is used as the voice frequency band and the consonant frequency band is excluded. This is because the levels of the vowels are mainly recognized as the magnitude of the human voice.

In this embodiment, the voice band concentration detector 50 includes a band pass filter (BPF) 51, a band elimination filter (BEF) 52, average level detectors 53 and 54, an amplifier 55, and a comparator 56, as shown in FIG. 5.

Figure 8A:
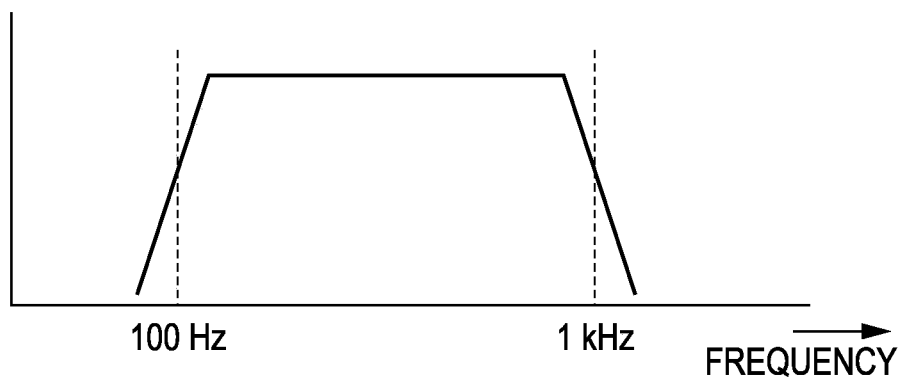
FIGS. 8A and 8B are frequency characteristic diagrams illustrating another partial configuration of the voice interval detector shown in FIG. 5.
Figure 8B:
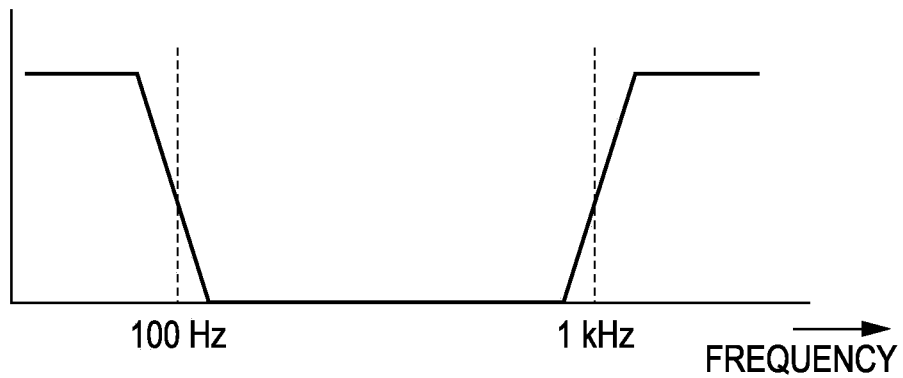

As shown in FIG. 8A, the band pass filter 51 is a filter having a band-pass characteristic in which the frequency band of 100 Hz to 1 kHz including the human voice is set as a band-pass zone in this example. As shown in FIG. 8B, the band elimination filter 52 is a filter having a band-pass characteristic in which the frequency band of 100 Hz to 1 kHz including the human voice is set as a band-non-pass zone. That is, the band elimination filter 52 is a filter having the frequency band not including the human voice as a band-pass zone.

The added signal Sm of the left and right channel input audio signals SiL and SiR from the amplifier 32 is supplied to the band pass filter 51 and the band elimination filter 52.

The band pass filter 51 extracts the signal component of the frequency band of 100 Hz to 1 kHz including the human voice from the added signal Sm and supplies the extracted signal component to the average level detector 53. The average level detector 53 detects the average level of the signal components of the frequency band of 100 Hz to 1 kHz in the added signal Sm. The detected average level signal BPFavr (see the waveform indicated by a solid line in FIG. 9) is output from the average level detector 53.

The band elimination filter 52 extracts the signal components of the frequency band of 100 Hz to 1 kHz not including the human voice from the added signal Sm and supplies the extracted signal components to the average level detector 54. The average level detector 54 detects the average level of the signal components of the frequency band of 100 Hz to 1 kHz not including the human voice in the added signal Sm. The detected average level signal BEFavr (see the waveform indicated by a one-dot chained line in FIG. 9) is output from the average level detector 54.

The average level signal BPFavr from the average level detector 53 is supplied to the comparator 56 without any change. The average level signal BEFavr from the average level detector 54 is weighted by the amplifier 55 and is then supplied to the comparator 56. Here, the weighting value of the amplifier 55 relates to the detection precision of the voice interval. In this example, the length of the interval detected as the voice interval becomes smaller as the weighting value of the amplifier 55 becomes greater. The weighting operation may be performed on the output BPFavr of the average level detector 53.

When the average level signal BPFavr of the frequency band including the voice is greater than the level obtained by weighting the average level BEFavr of the frequency band not including the voice, the comparator 56 determines that the voice band concentration interval is detected and raises a voice band concentration detection flag FLGb. In this example, the voice band concentration detection flag FLGb in the detected voice band concentration interval is set to a high level ("1"), as shown in FIG. 9.

In this way, the voice band concentration detection flag FLGb detected by the voice band concentration detector 50 is supplied to the AND gate 340.

In the above description, the band pass filter 51 and the band elimination filter 52 are used. However, the means for extracting the signal of the frequency band including the human voice and the signal of the frequency band not including the human voice is not limited to the above-mentioned filters, but the bands may be separated using filters such as a low-pass filter or a high-pass filter.

The comparator 56 may compare the signal of the frequency band including the human voice and the signal of the frequency band not including the human voice with the input signal thereof. The comparator may compare the difference between the signal of the frequency band including the human voice or the signal of the frequency band not including the human voice and the input signal with the signal of the frequency band including the human voice or the signal of the frequency band not including the human voice.

Center Orientation Detector

For example, in the contents of a stereo broadcast of a radio broadcast or a television broadcast, most human speech is oriented to the center so as to make the human speech audible. Accordingly, the interval including the human voice has an orientation distribution concentrated on the center.

Accordingly, by specifying the interval including the signal component oriented to the center in the stereo audio signal, it is possible to specify the interval including the human voice. That is, it is possible to detect the voice interval using the center orientation component in the stereo audio signal as a feature quantity for detecting the voice interval. By extracting the center orientation component from the stereo audio signal, it is possible to exclude a part other than the vocal part oriented on the center, such as musical signal parts spread to left and right.

As shown in FIG. 5, the center orientation detector 60 includes an orientation distribution detector 61 and a center orientation concentration detector 62. The left and right channel input audio signals SiL and SiR are supplied to the orientation distribution detector 61. The orientation distribution temporarily varying in the input audio signals is detected by the orientation distribution detector 61.

The information of the orientation distribution detected by the orientation distribution detector 61 is supplied to the center orientation concentration detector 62. The time interval where the components oriented to the center are concentrated is detected by the center orientation concentration detector 62. The center orientation concentration detector 62 outputs a center orientation concentration detection flag FLGc indicating the time interval in which the components oriented on the center are concentrated.

Figure 10:
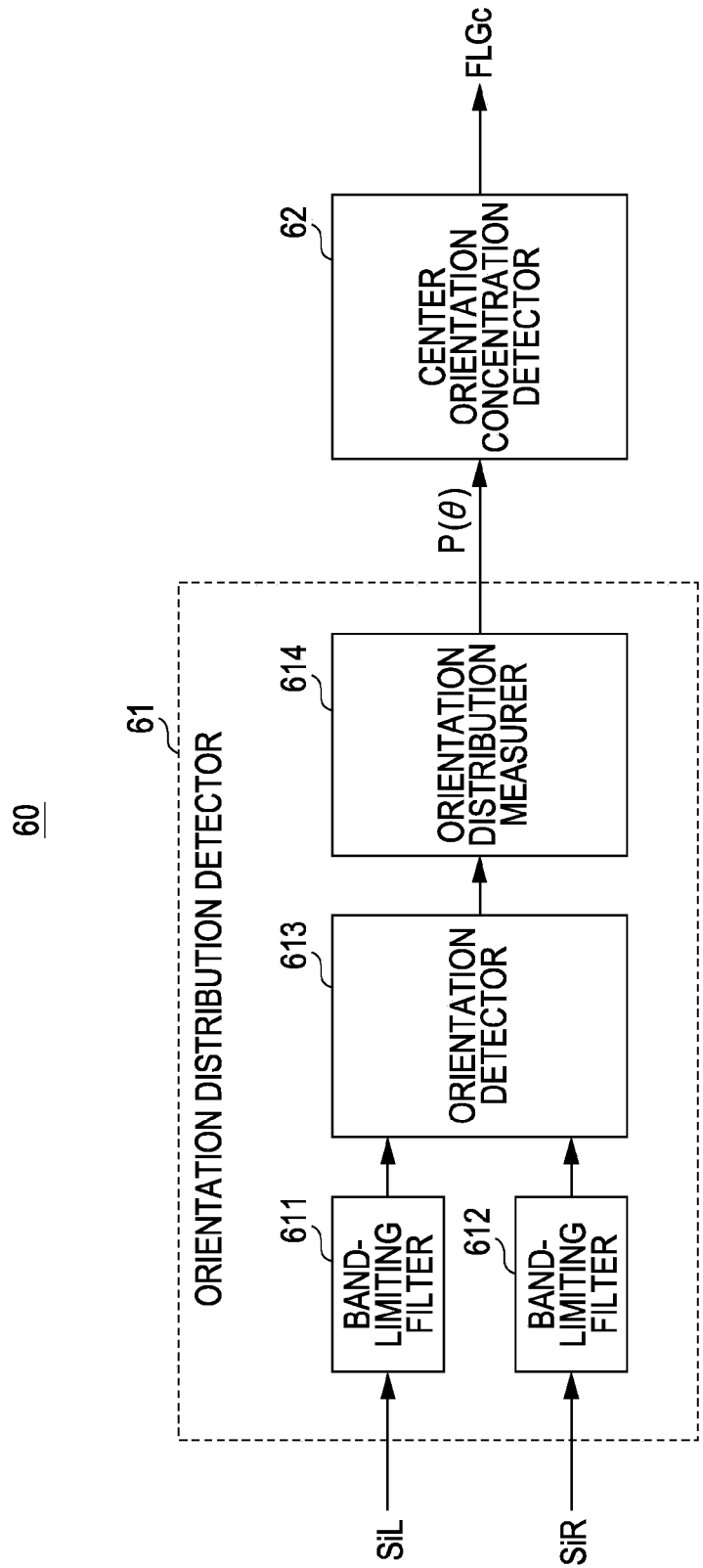
FIG. 10 is a block diagram illustrating another partial configuration of the voice interval detector shown in FIG. 5.

The orientation distribution detector 61 includes band-limiting filters 611 and 612, an orientation detector 613, and an orientation distribution measurer 614, as shown in FIG. 10.

For example, the frequency-band components such as low-band components hardly giving a feeling of orientation are removed from the left and right channel input audio signals SiL and SiR input to the center orientation distribution detector 60 by the band-limiting filters 611 and 612.

The two channel input audio signals SiL and SiR of which the band is limited by the band-limiting filters 611 and 612 are supplied to the orientation detector 613. The orientation detector 613 detects the orientations of the two channel input audio signals SiL and SiR at the orientation detecting time in each predetermined period on the basis of the magnitude of the levels of the two channel input audio signals SiL and SiR to which the band is limited.

That is, the orientation detector 613 samples the levels (amplitudes) of the two channel input audio signals SiL and SiR to which the band is limited with a predetermined sampling period. In this example, the orientation detector 613 detects the orientation at the latest sampling time as the orientation at the present time.

In this case, the orientation detector 613 detects the orientation at the latest sampling time using the levels of the input audio signals SiL and SiR at the latest sampling time and at the previous sampling time.

When the two channel input audio signals SiL and SiR are digital audio signals, the sampling period can be set to be equal to the sampling period of the digital audio signals. The sampling period may not be equal to one sampling period of the digital audio signal, but may be set to be equal to plural sampling periods. When the input audio signals of the orientation detector 613 are analog signals, the analog signal may be converted into a digital audio signal at an input stage of the orientation detector 613.

Figure 11A:
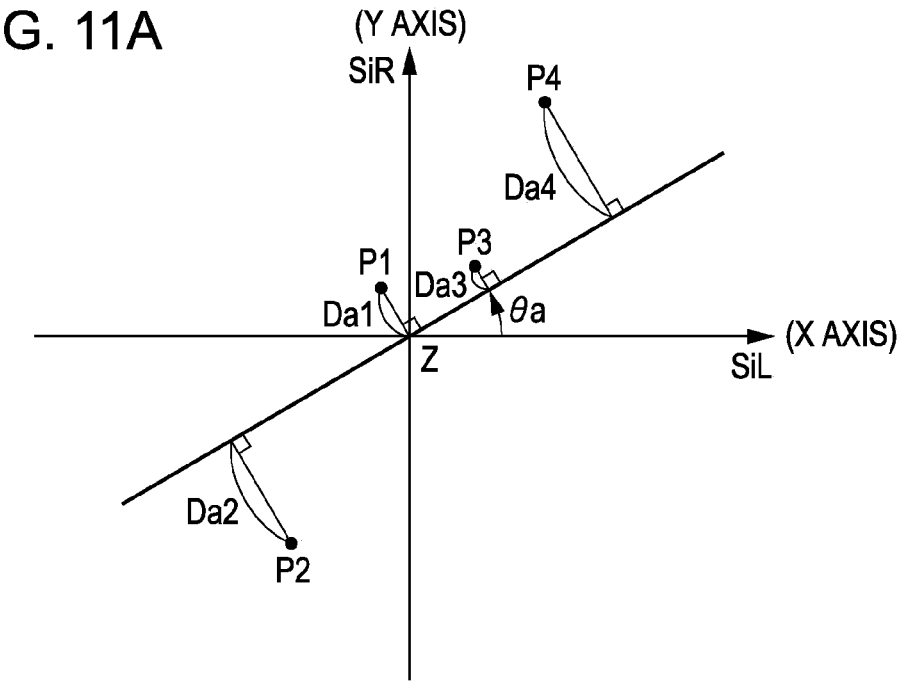
FIGS. 11A and 11B are diagrams illustrating the units of the configuration shown in FIG. 10.
Figure 11B:
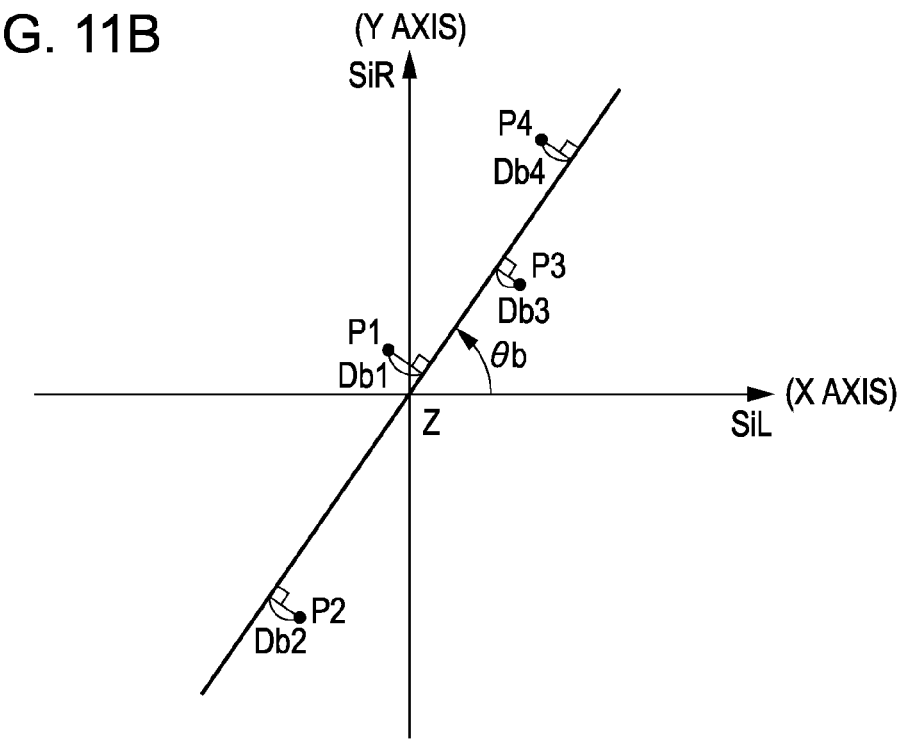

The method of detecting an orientation in the orientation detector 613 will be described now with reference to FIGS. 11A and 11B. FIGS. 11A and 11B show a coordinate space where the X axis represents the amplitude of the left channel input audio signal SiL and the Y axis represents the amplitude of the right channel input audio signal SiR.

The orientation detector 613 acquires the levels of the two channel input audio signals SiL and SiR at the orientation detecting time in each sampling period and plots the coordinate points corresponding thereto in the coordinate space shown in FIGS. 11A and 11B, like P1, P2, P3, and P4. In this example, P4 is the coordinate point at the latest detecting time.

When a straight line (straight line passing through an intersection Z of the X axis and the Y axis) expressed by y=k·x (where k is a constant) is made to rotate about the intersection Z by ±90°, that is, when the constant k is changed, the orientation detector 613 calculates with what constant k (with what slope angle) the plotted coordinate points P1, P2, P3, and P4 get closest to the straight line. That is, the orientation detector calculates the constant k of the straight line having the smallest total sum of the distances Da1, Da2, Da3, and Da4 or the distances Db1, Db2, Db3, and Db4 from the straight lines with different constants k to the coordinate points P1, P2, P3, and P4.

The orientation detector 613 sets the slope angle corresponding to the calculated constant k of the straight line as the orientation at the present time to be detected. In the example of FIGS. 11A and 11B, the orientation is detected in a state where the X axis, that is, the angle of the orientation (left direction) of the left channel is 0° and the angle θ about the X axis (hereinafter, referred to as "orientation angle") is the orientation angle.

In the example of the coordinate points P1, P2, P3, and P4 in FIG. 11A, the orientation angle is detected as θa. In the example of the coordinate points P1, P2, P3, and P4 of FIG. 11B, the orientation angle is detected as θb.

In this embodiment, the orientation detector 613 does not use the same weight for the levels of the two channel input audio signals at the present time (at the latest sampling time) and the levels of the two channel input audio signals at the previous sampling time. In this embodiment, the orientation detector 613 uses the greater weight for the levels of the two channel input audio signals at the sampling time closest to the present time.

Figure 12:
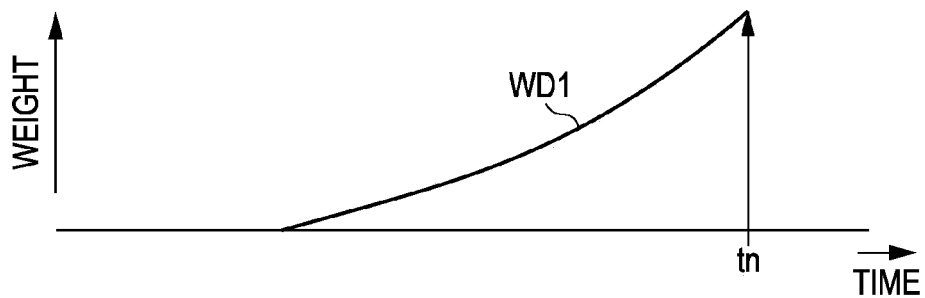
FIG. 12 is a diagram illustrating the units of the configuration shown in FIG. 10.

Accordingly, the orientation detector 613 employs a time window WD1 having such an exponential curve characteristic that the weight for the sampling values of the levels of the two channel input audio signals becomes greater as it nears the present time (the latest sampling time to in this example) as shown in FIG. 12.

In the above description, the present time which is the time for the processing signal is set to the latest sampling time (latest sample time). However, a delay circuit for delay by a predetermined time τ may be provided between the input stage of the input audio signals SiL and SiR and the variable gain amplifiers 21L and 21R and the present time as a processing time may be set to a time obtained by delaying the input audio signals SiL and SiR by the predetermined time τ.

In this case, the orientation detector 613 can detect the orientation also using the two channel input audio signals SiL and SiR in the future from the present time as a processing time. For example, in the example shown in FIGS. 11A and 11B, the present time as the processing time may be set to P2 or P3.

Figure 13:
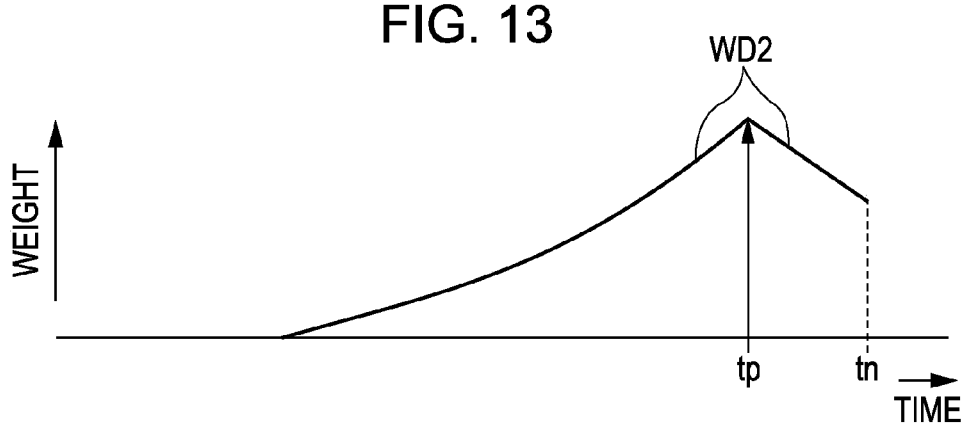
FIG. 13 is a diagram illustrating the units of the configuration shown in FIG. 10.

In this case, a time window WD2 having an exponential curve characteristic shown in FIG. 13 is used instead of the time window WD1. The time window WD2 has such an exponential curve characteristic that the weight at the present time tp as the processing time is greatest and the weight becomes smaller as it departs further from the present time tp, that is, as it departs to the past and the future.

The levels of the two channel input audio signals at the present time can be used without any change, without weighting the levels of the two channel input audio signals SiL and SiR at the past and/or future sampling time.

In this way, the orientation detector 613 can detect the orientation angle θ indicating the orientation of the two channel input audio signals SiL and SiR at the present time.

However, the detected orientation angle θ at the present time serves to define the orientation of the input audio signals at a time in one direction and does not reflect the intensity of signal in the corresponding direction. Therefore, in this embodiment, the detection result (orientation angle θ) of the orientation of the two channel input audio signals SiL and SiR at the present time detected by the orientation detector 613 is supplied to the orientation distribution measurer 614 in consideration of this point.

The orientation distribution measurer 614 calculates a distribution of the orientation angle θ in the entire orientations detected by the orientation detector 613 over a predetermined time interval d, and measures what ratio the orientations of the two channel input audio signals have in the corresponding direction.

In this case, the predetermined time interval d is selected, for example, as several milliseconds to several hundred milliseconds and several ten milliseconds in this example. In this embodiment, the orientation distribution measurer 614 weights the orientation angle θ detected at the predetermined time interval d by the orientation detector 613 in the same way as the weighting coefficient characteristic of the orientation detector 613.

Figure 14:
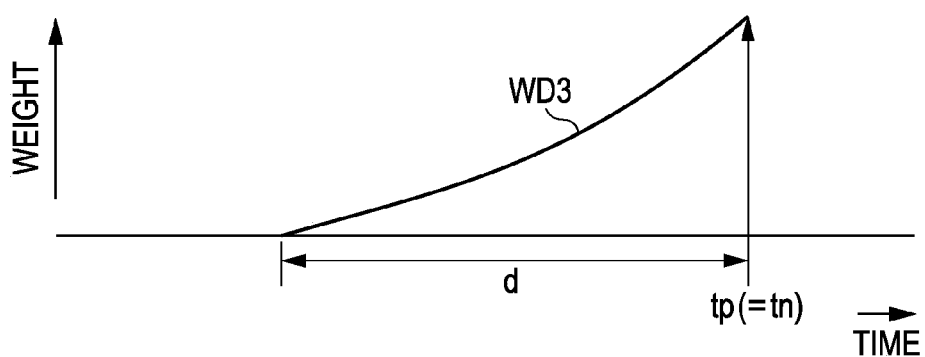
FIG. 14 is a diagram illustrating the units of the configuration shown in FIG. 10.

That is, the orientation distribution measurer 614 performs the weighting operation using a time window WD3 (see FIG. 14) where the weight exponentially increases as it nears the present time tp (tp=tn (the latest sampling time) in this example).

As described above, the time delay τ is prepared for the input audio signals and the time window of the orientation distribution measurer 614 is the same as shown in FIG. 13 when the time window for weighting in the orientation detector 613 is set to the same as shown in FIG. 13. In this case, the time interval d is a time interval including both the future and the past from the present time tp. The orientations may be used with non-weighted values.

Figure 15:
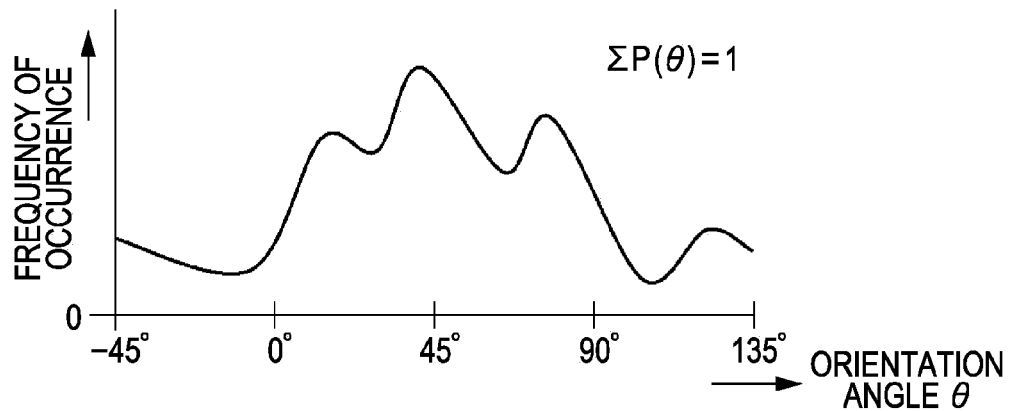
FIG. 15 is a diagram illustrating the units of the configuration shown in FIG. 10.

FIG. 15 is a diagram illustrating an example of an orientation distribution P(θ) which is the distribution of the orientation angle θ calculated by the orientation distribution measurer 614, where the horizontal axis represents the orientation angle θ about the X axis (the left channel orientation) and the vertical axis represents the frequency of occurrence (<1) of each orientation angle. In this embodiment, when the total sum of the orientation distribution P(θ) is calculated at all the orientation angles θ, the distribution is generated so that the total sum is 1, that is, ΣP(θ)=1.

Figure 16:
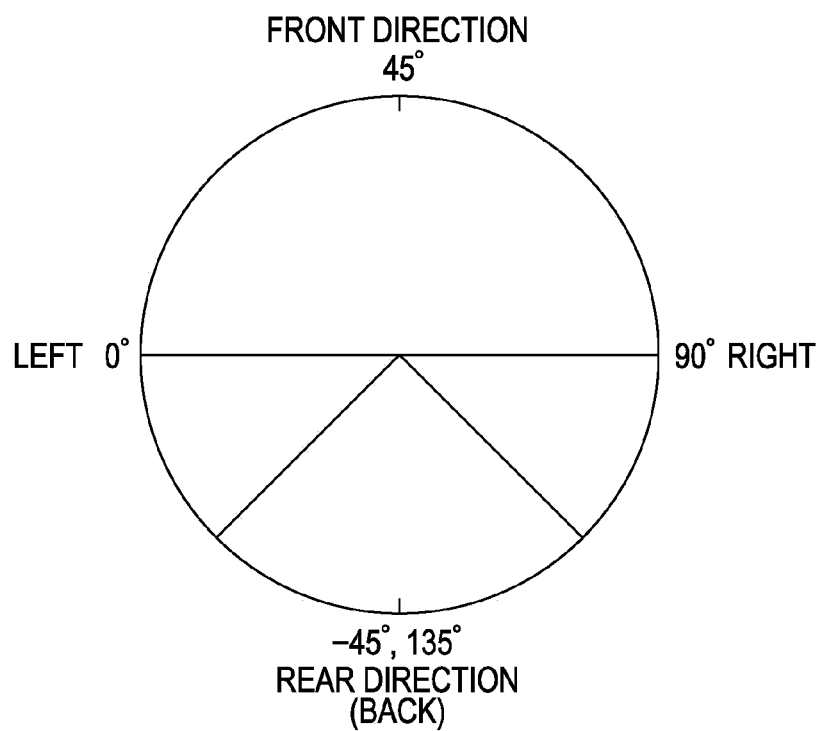
FIG. 16 is a diagram illustrating the units of the configuration shown in FIG. 10.

The relation of the orientation angle θ and the orientation of the audio signals is shown in FIG. 16. The front, the left, and the right shown in FIG. 16 are direction names based on a listener.

In this way, the information on the orientation distribution P(θ) shown in FIG. 15 is obtained at the present time (present sampling time or present sample time: processing time) from the orientation distribution measurer 614.

The information of the orientation distribution P(θ) is supplied to the center orientation concentration detector 62. The center orientation concentration detector 62 calculates a center orientation distribution signal by weighting the orientation distribution P(θ), which is calculated by the orientation distribution detector 61, mainly in the center direction.

Figure 17:
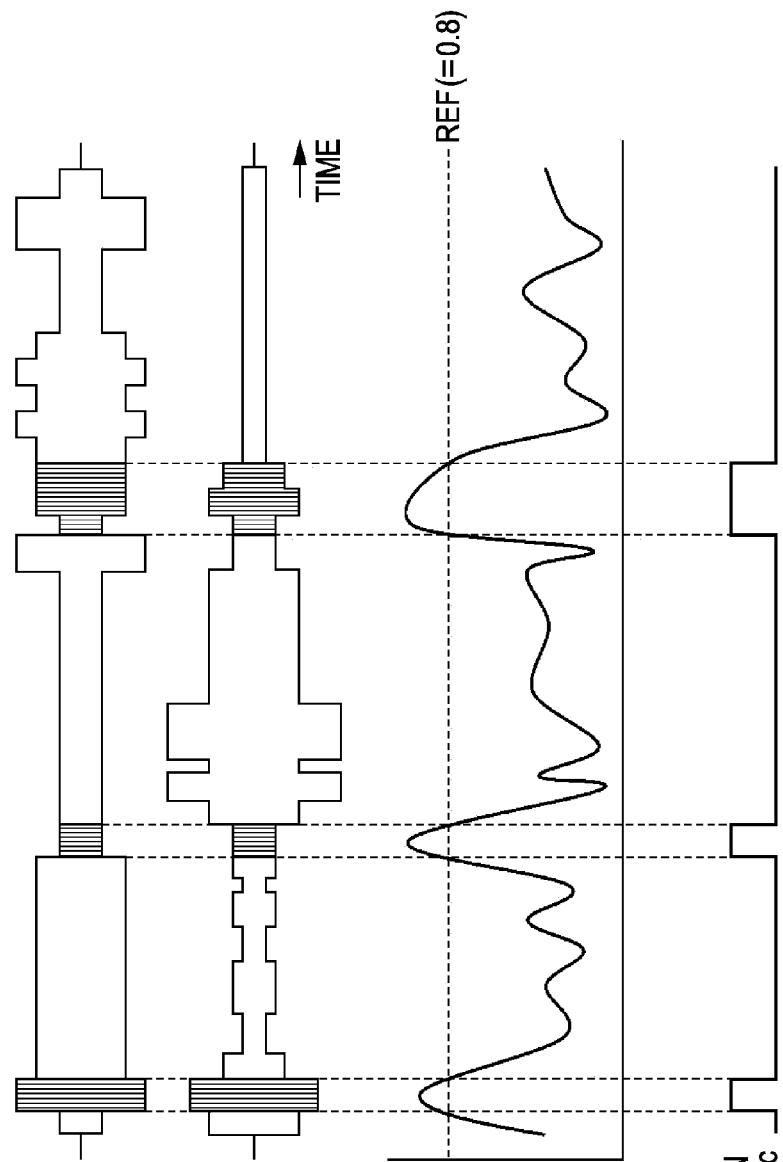
FIGS. 17A to 17D are waveform diagrams illustrating the operation of the configuration shown in FIG. 10.

It is considered that the left channel audio signal SiL and the right channel audio signal SiR are, for example, signals shown in FIGS. 17A and 17B. In FIGS. 17A and 17B, the part marked by the vertical lines with a constant gap represents the interval including the voice component oriented on the center.

In the example shown in FIGS. 17A to 17D, the center orientation distribution signal calculated by the center orientation concentration detector 62 is the same as shown in FIG. 17C.

The center orientation concentration detector 62 compares the value of the calculated center orientation distribution signal with a predetermined reference value REF and detects an interval in which the value of the center orientation distribution signal is greater than the reference value REF as the center orientation detection interval. In the example shown in FIGS. 17A to 17D, the reference value REF is set to 0.8 (=80%). The center orientation concentration detector 62 outputs the center orientation detection flag FLGc indicating the detected center orientation detection interval.

In this way, the center orientation detection flag FLGc from the center orientation detector 62 is supplied to the AND gate 340.

The method of detecting the center orientation concentration component to detect the voice interval is not limited to the method allowing the orientation distribution detector 61 to utilize the center orientation concentration detector 62. For example, simply, the center orientation concentration signal may be extracted as the sum of the two channel input audio signals SiL and SiR and the interval in which the extracted center orientation concentration signal is greater than a predetermined reference value may be detected as the voice interval.

Generation of Voice Interval Detection Flag

The AND gate 340 outputs the logical product of the voice period detection flag FLGa from the voice period detector 40, the voice band concentration detection flag FLGb from the voice band concentration detector 50, and the center orientation detection flag FLGc from the center orientation detector 60 as the voice interval detection flag FLG.

The voice period detection flag FLGa, the voice band concentration detection flag FLGb, and the center orientation detection flag FLGc are flags representing the feature quantities for detecting the voice interval. The AND gate 340 generates the voice interval detection flag FLG which is the detection output of the voice interval by taking the logical product of three flags FLGa, FLGb, and FLGc, thereby enhancing the detection precision of the voice interval.

As described above, according to the first embodiment of the invention, the average level of the voice interval indicated by the voice interval detection flag FLG in the input audio signals is calculated and the gain is controlled using the average level as a reference level. Therefore, since the level of sounds of the human voice such as speech included in the input audio signals is controlled to be constant, speech or the like can be made audible.

In the first embodiment, the voice interval detector 34 generates the voice interval detection flag FLG which is the detection output of the voice interval by generating three flags FLGa, FLGb, and FLGc on the basis of three types of feature quantities for detecting the voice interval and taking the logical product thereof.

However, to simplify the process, the flag generated on the basis of one of three types of feature quantities may be used as the voice interval detection flag FLG. By combining two or three types of feature quantities and taking the flags generated on the basis of the combined two feature quantities, the voice interval detection flag FLG may be generated.

When one of three types of feature quantities or the combination of two thereof is used, selecting operation means for the selection may be provided and a user may be made to manually select the feature quantity using the selecting operation means.

A silence detector detecting the silence in the input audio signal Sm may be provided to the voice interval detector 34 and the voice interval detection flag FLG may be masked in the silence interval detected by the silence detector, whereby the silence interval may be excluded from the voice interval. In this case, since a part having no signal or a background noise part can be excluded, it is possible to further enhance the detection precision of the voice interval.

The feature quantities for the voice signal for detecting the voice interval are not limited to the above-mentioned three types, but other feature quantities may be used.

Sound Volume Correcting Device according to Second Embodiment

In the first embodiment, the gain of the input audio signal is controlled using the average level of the voice signal as a reference level. Accordingly, when the average level of the voice signal is low, the gain of the entire input audio signal is controlled to increase. As a result, when the level of the non-human voice component is higher than the level of the voice signal and the difference therebetween is great, the sound volume of the non-human voice component increases excessively. In case of contents not including the human voice, the sound volume of the non-voice sound may increase excessively.

A second embodiment of the invention is contrived to solve the above-mentioned problem. In the second embodiment described below, the sound volume correcting device is applied to the sound volume corrector 18 of the television broadcast receiver shown in FIG. 2, similarly to the first embodiment.

Figure 18:
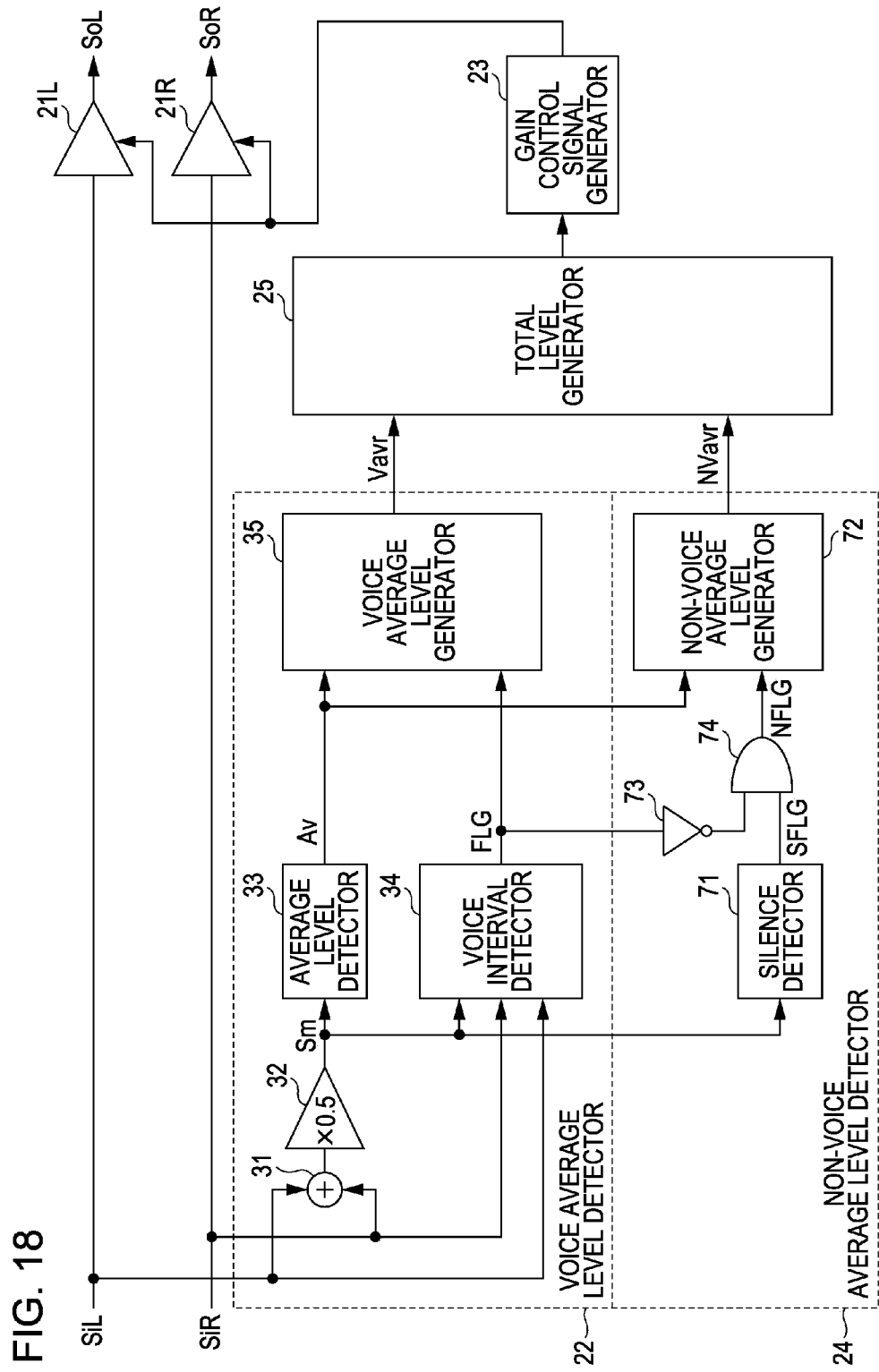
FIG. 18 is a block diagram illustrating a sound volume correcting device according to a second embodiment of the invention.

FIG. 18 is a block diagram illustrating the entire configuration of the sound volume corrector 18 according to the second embodiment. In FIG. 18, the same elements as the sound volume corrector 18 according to the first embodiment shown in FIG. 1 are referenced by the same reference numerals and signs.

In the second embodiment, a non-voice average level detector 24 and a total level generator 25 are provided in addition to the voice level detector 22 according to the first embodiment. The non-voice average level detector 24 generates the average level NVavr of the non-voice signal interval from the added signal Sm, as described later.

The voice average level signal Vavr which is the output signal of the voice average level detector 22 and the non-voice average level signal NVavr which is the output signal of the non-voice average level detector 24 are supplied to the total level generator 25.

The total level generator 25 generates a combined level signal from the voice average level signal Vavr and the non-voice average level signal NVavr and supplies the combined level signal to the gain control signal generator 23. Accordingly, in the second embodiment, the gain control signal generator 23 generates the gain control signal using the level of the combined level signal from the total level generator 25 as a reference level and supplies the generated control gain signal to the variable gain amplifiers 21L and 21R.

The configuration of the voice average level detector 22 is the same as the first embodiment and thus the detailed description thereof will be omitted.

Non-Voice Average Level Detector

The non-voice average level detector 24 includes a silence detector 71, a non-voice average level generator 72, an inverter 73, and an AND gate 74, as shown in FIG. 18.

The silence detector 71 receives the added audio signal Sm from the amplifier 32 of the voice average level detector 22 as an input signal and detects a silence interval of the added audio signal Sm. The silence detector 71 outputs a silence interval detection flag SLFG representing the detected silence interval. The silence detecting method in the silence detector 71 can employ methods in the past and thus detailed description thereof will be omitted.

Figure 19A:
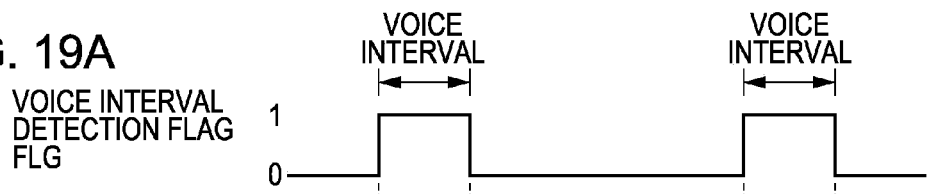
FIGS. 19A to 19C are timing diagrams illustrating the operations in the second embodiment.
Figure 19B:

As shown in FIG. 19B, in this embodiment, the silence interval detection flag SLFG from the silence detector 71 is a signal which is set to the low level ("0") in the silence interval and which is set to the high level ("1") in the non-silence interval. The silence interval detection flag SLFG from the silence detector 71 is supplied to the AND gate 74.

The voice interval detection flag FLG (see FIG. 19A) from the voice interval detector 34 of the voice average level detector 22 is inverted in polarity by the inverter 73 and is then supplied to the AND gate 74.

Figure 19C:
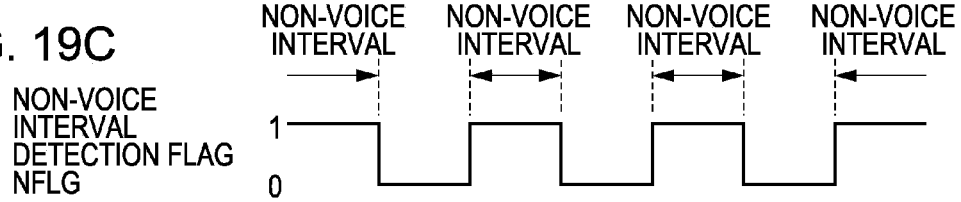

Accordingly, as shown in FIG. 19C, it is possible to obtain the non-voice interval detection flag NFLG which is set to the high level in the non-voice interval other than the silence interval and the voice interval. The non-voice interval detection flag NFLG is supplied to the non-voice average level generator 72. The average level signal Av of the added audio signal Sm from the average level detector 33 of the voice average level detector 22 is supplied to the non-voice average level generator 72.

Figure 20:
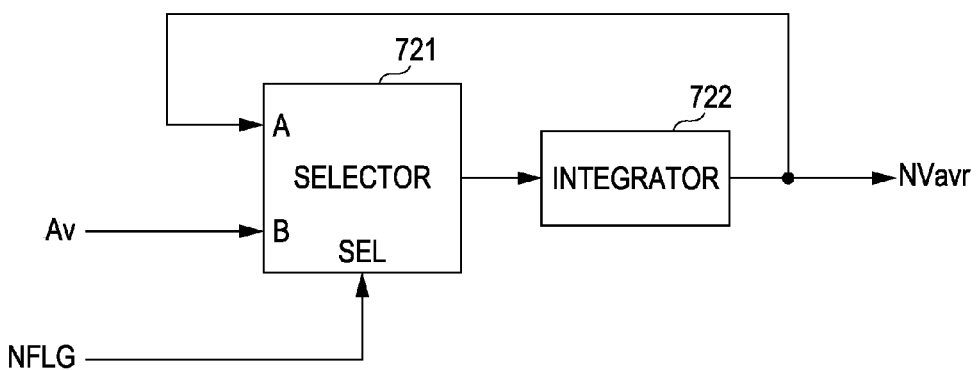
FIG. 20 is a block diagram illustrating a configuration of a non-voice average level generator according to the second embodiment shown in FIG. 18.

The non-voice average level generator 72 has the same configuration as the voice average level generator 35 shown in FIG. 3 and includes a selector 721 and an integrator 722 as shown in FIG. 20. The non-voice average level generator 72 is different from the voice average level generator 35, in that the selection control signal supplied to the selector 721 is not the voice interval detection flag FLG but the non-voice interval detection flag NFLG.

Accordingly, in the non-voice average level generator 72, the average level signal Av is input from the selector 721 to the integrator 722 in the non-voice interval and the output of the integrator is input from the selector 721 to the integrator 722 in the silence interval and the voice interval.

Therefore, in the non-voice interval, the integrator 722 integrates and averages the signal levels of the non-voice interval in the average level signal Av from the average level detector 33 using the previous output (holding value) of the integrator 722 as an initial value. In the silence interval and the voice interval, the integrator 722 holds the final signal level in the non-voice interval.

As a result, the output signal NVavr of the integrator 722 of the non-voice average level generator 72 represents the average level in the non-voice interval.

Total Level Generator

Figure 21:
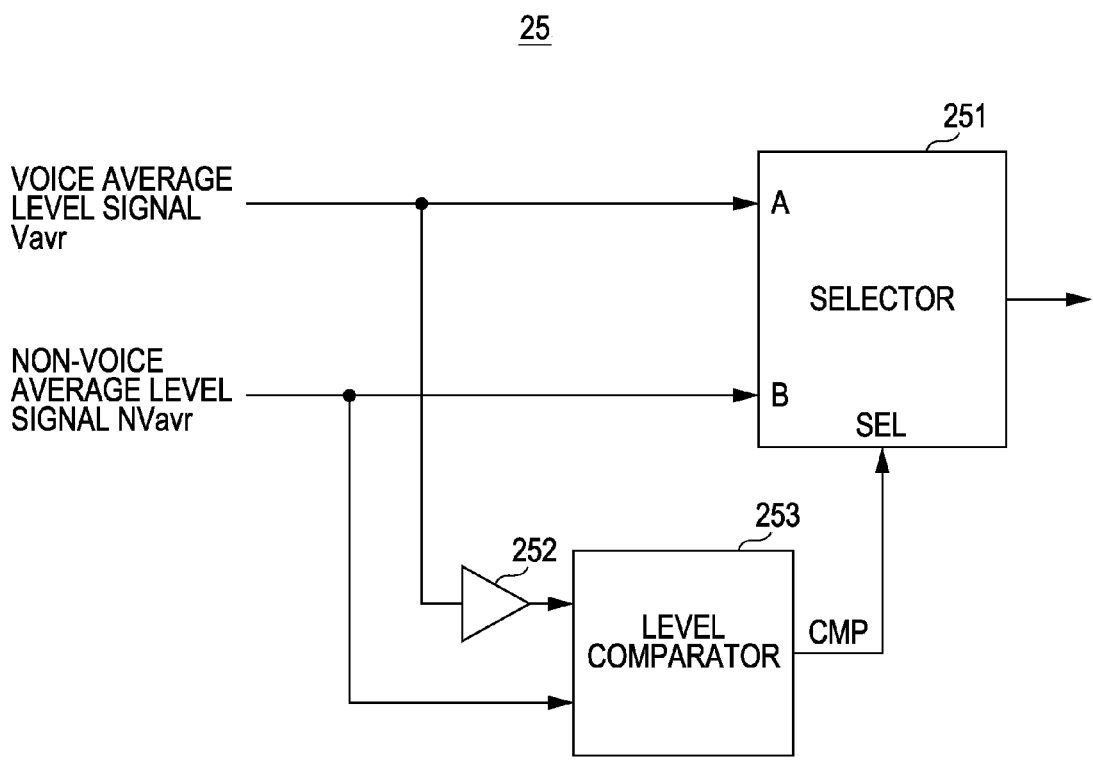
FIG. 21 is a block diagram illustrating a configuration of a total level generator according to the second embodiment shown in FIG. 18.

FIG. 21 shows the configuration of the total level generator 25 according to this embodiment.

The total level generator 25 according to this embodiment includes a selector 251, a weighting amplifier 252, and a level comparator 253. An input terminal A of the selector 251 is supplied with the voice average level signal Vavr from the voice average level detector 22 and the other input terminal B of the selector 251 is supplied with the non-voice average level signal NVavr from the non-voice average level detector.

The level comparator 253 is supplied with the signal obtained by weighting the voice average level signal Vavr from the voice average level detector 22 by the use of the weighting amplifier 252 and the non-voice average level signal NVavr from the non-voice average level detector. The weight in the amplifier 252 is used to set a reference level for allowing the sound volume to excessively be great by the gain control when the level of the non-human voice component is higher than the reference level and is two times (×2) in this example.

Both signals are compared by the level comparator 253 and the comparison result output CMP thereof is supplied as the selection control signal to the selector 251. Here, the comparison result output CMP is set to the value, for example, "1", for allowing the selector 251 to output the voice average level signal Vavr input to the input terminal A when the two times level value of the voice average level signal Vavr is greater than the value of the non-voice average level signal NVavr. The comparison result output CMP is set to the value, for example, "0", for allowing the selector 251 to output the non-voice average level signal NVavr input to the other input terminal B when the value of the non-voice average level signal NVavr is greater than the two times level value of the voice average level signal Vavr.

Accordingly, in the range (NVavr<2Vavr) where the non-voice average level signal NVavr is not greater than two times the level value of the voice average level signal Vavr, similarly to the first embodiment, the selector 251 selects and supplies the voice average level signal Vavr to the gain control signal generator 23. Accordingly, in the range (NVavr<2Vavr), similarly to the first embodiment, the gains of the variable gain amplifiers 21L and 21R are controlled using the voice average level signal Vavr as the reference level, whereby the volume level is controlled to allow the human voice such as speech to be audible.

In the range (NVavr≥2Vavr) where the non-voice average level signal NVavr is greater than two times the level value of the voice average level signal Vavr, the selector 251 selects and supplies the non-voice average level signal NVavr to the gain control signal generator 23. Accordingly, in the range (NVavr≥2Vavr), the gains of the variable gain amplifiers 21L and 21R are controlled using the non-voice average level signal NVavr as the reference level, whereby the non-voice sound volume is prevented from increasing abnormally.

In FIG. 18, the non-voice average level signal NVavr is compared with the signal obtained by weighting the voice average level signal Vavr and one of the non-voice average level signal NVavr and the voice average level signal Vavr is supplied to the gain control signal generator 23 depending on the comparison output.

Figure 22:
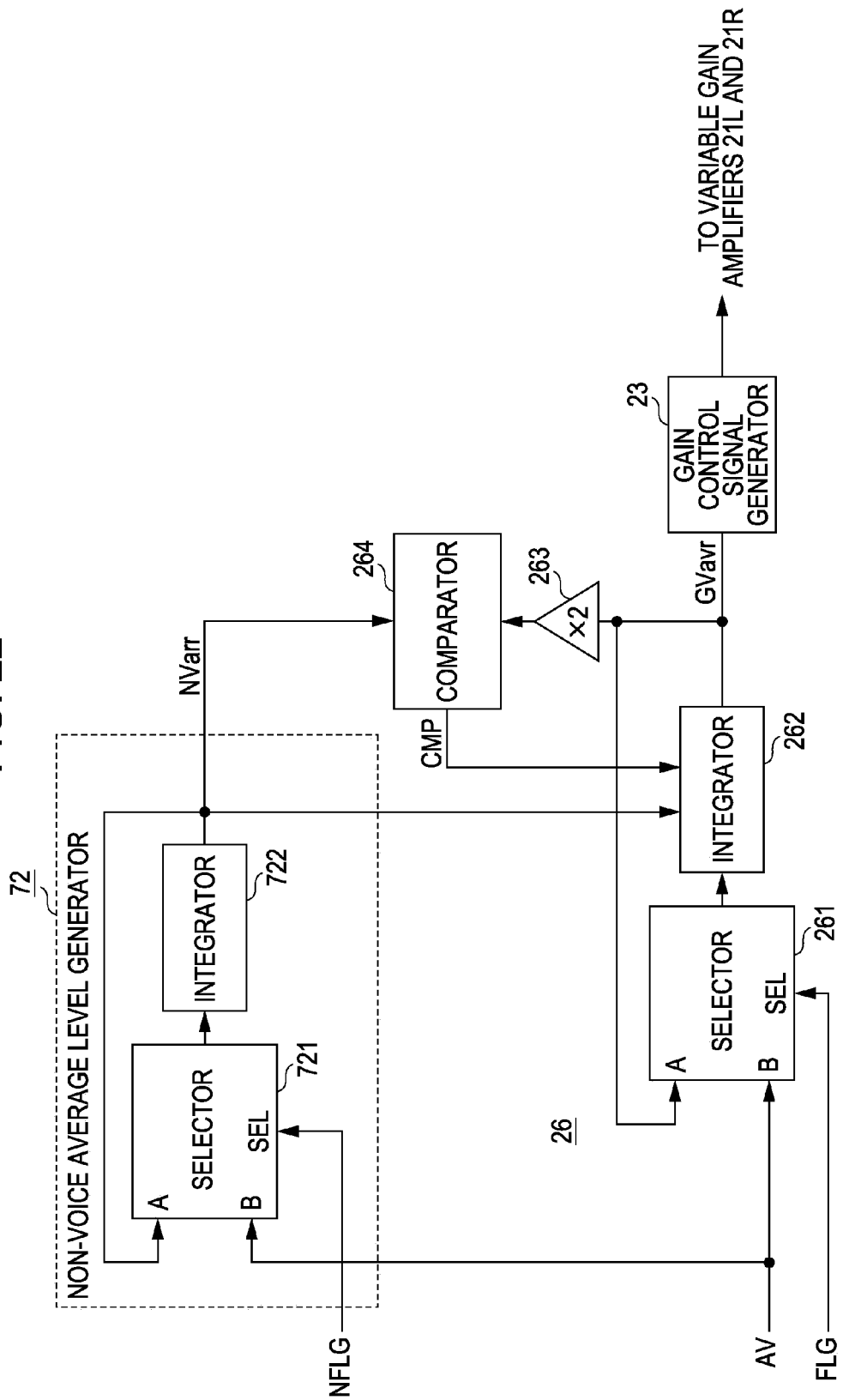
FIG. 22 is a block diagram illustrating another partial configuration of the sound volume correcting device according to the second embodiment of the invention.

However, the voice average level generator 35, the non-voice average level generator 72, and the total level generator 25 shown in FIG. 18 may be constructed as shown in FIG. 22.

In the example shown in FIG. 22, the non-voice average level generator 72 is provided similarly to the example shown in FIG. 18. In the example shown in FIG. 22, a total average level generator 26 is provided instead of the voice average level generator 35 and the total level generator 25.

The total average level generator 26 includes a selector 261 and an integrator 262, similarly to the voice average level generator 35. The total average level generator 26 further includes a weighting amplifier 263 and a comparator 264.

The input terminal A of the selector 261 is supplied with the output signal (total average level signal GVavr) of the integrator 262. The input terminal B of the selector 261 is supplied with the average level signal Av from the voice average level detector 33 and the selection control terminal of the selector 261 is supplied with the voice interval detection flag FLG.

The output signal of the selector 261 selected by the voice interval detection flag FLG is supplied to the integrator 262. The output signal of the integrator 262 is doubled in level by the weighting amplifier 263 and is then supplied to the comparator 264. The comparator 264 is also supplied with the non-voice average level signal NVavr which is the output signal of the integrator 722 of the non-voice average level generator 72.

The non-voice average level signal NVavr which is the output signal of the integrator 722 of the non-voice average level generator 72 is supplied to the integrator 262 and the output signal CMP which is the comparison result of the comparator 264 is supplied to the integrator 262. The integrator 262 performs a process of changing the integrated output value, which is held when the condition to be described later is satisfied by the output signal CMP of the comparator 264, into the non-voice average level signal NVavr from the non-voice average level generator 72.

The processing operations in the example shown in FIG. 22 will be described now.

In the example shown in FIG. 22, the total average level generator 26 and the non-voice average level generator 72 perform the above-mentioned integrating operation on the average level signal Av from the voice average level detector 33.

However, in the total average level generator 26, the average level signal Av is output from the selector 261 in the voice interval indicated by the voice interval detection flag FLG, and the integrating operation using the total average level GVavr as an initial value is performed by the integrator 262. In the non-voice interval, the output signal of the integrator 262 is output from the selector 261 and the value of the total average level GVavr is held (pre-held) as the output of the integrator 262.

On the other hand, in the non-voice average level generator 72, in the non-voice interval indicated by the non-voice interval detection flag, the average level signal Av is output from the selector 721 and the integrating operation using the non-voice average level signal NVavr as an initial value is performed by the integrator 722. In the voice interval, the output signal of the integrator 722 is output from the selector 721 and the value of the non-voice average level signal NVavr is held (pre-held) as the output of the integrator 262.

The comparator 264 compares the non-voice average level signal NVavr from the non-voice average level generator 72 with the two times value of the total average level signal GVavr from the total average level generator 26 via the amplifier 263 and supplies the comparison output CMP to the integrator 262.

The integrator 262 determines whether the non-voice average level signal NVavr is in the range (NVavr<2GVavr) where it is not greater than the two times level value of the total average level signal GVavr or in the range (NVavr≥2GVavr) where it is greater than the two times level value, on the basis of the comparison result CMP.

When it is determined that it is in the range of NVavr<2GVavr, the integrator 262 generates and outputs the voice average level signal Vavr as the total average level signal GVavr, similarly to the first embodiment without changing the value of the holding portion holding the integration result.

That is, when the comparison output CMP from the comparator 264 satisfies NVavr<2GVavr, the integrator 262 ignores the non-voice average level signal NVavr from the non-voice average level generator 72 and performs the same process as the first embodiment.

When it is determined that it is in the range of NVavr≥2GVavr, the integrator 262 changes the value of the holding portion holding the integration result to the non-voice average level signal NVavr. Accordingly, in the range of NVavr≥2GVavr, the non-voice average level signal NVavr becomes the output of the integrator 262.

Then, in the range of NVavr<2GVavr, the integrator 262 stops the operation of changing the value of the holding portion holding the integration result to the non-voice average level signal NVavr on the basis of the comparison output CMP and is returned to the processing state where it integrates the output of the selector 261.

In the example shown in FIG. 22, the acquired output signal of the integrator 262 is supplied as the total average level signal GVavr to the gain control signal generator 23. The gain control signal generator 23 generates the gain control signal using the total average level signal GVavr as the reference level.

Other Embodiments and Modified Examples

In the above-mentioned embodiments, the voice average level or non-voice average level of the input audio signals is detected and the gain is controlled, in real time. However, the invention is not limited to the real-time process.

For example, the gain control signal may be generated and may be recorded to be correlated with the recorded signals, by detecting the voice average level or the non-voice average level of the audio signals recorded on a recording medium. In this case, the sound volume of the reproducing audio signals can be controlled using the recorded gain control signal at the time of reproducing the audio signals.

Figure 23:
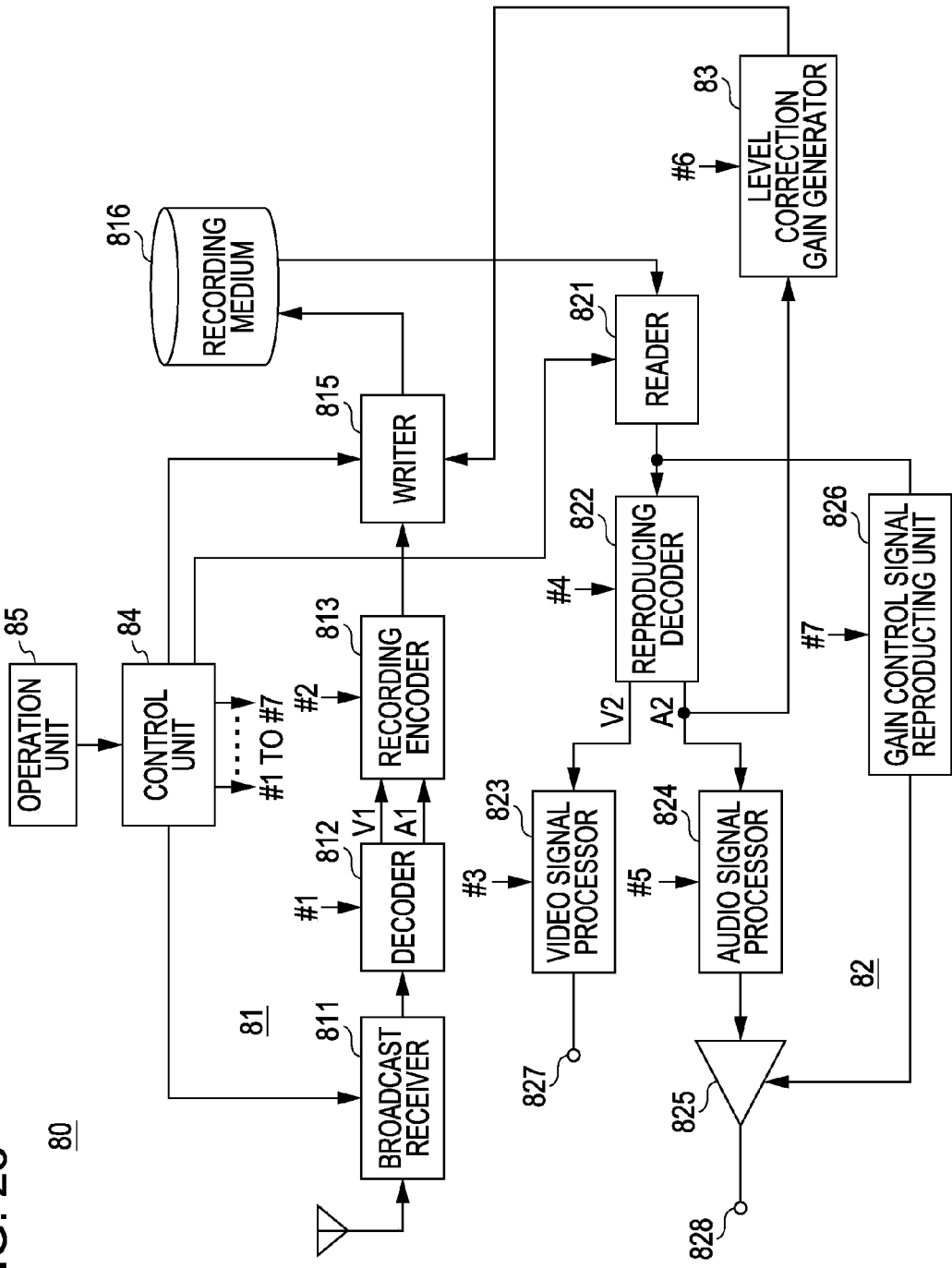
FIG. 23 is a diagram illustrating another example of an electronic apparatus employing the sound volume correcting device according to an embodiment of the invention.

FIG. 23 is a block diagram illustrating an example where the invention is applied to a recording and reproducing apparatus recording television broadcast signals on a recording medium such as a hard disk or a DVD (Digital Versatile Disc).

The recording and reproducing apparatus 80 shown in FIG. 23 includes a broadcast recording system 81, a reproducing system 82, a level correction gain generator 83, a control unit 84, and an operation unit 85. The operation unit 85 includes, for example, a remote controller transceiver. The control unit 84 includes, for example, a micro computer and controls the units of the recording and reproducing apparatus 80 in accordance with the operation input from the operation unit 85.

In the first embodiment shown in FIG. 1, the level correction gain generator 83 includes a voice average level detector 22 and a gain control signal generator 23. In the second embodiment shown in FIG. 18, the level correction gain generator includes a voice average level detector 22, a non-voice average level detector 24, a total level generator 25, and a gain control signal generator 23.

When a user operates the operation unit 85 to give a recording instruction, the control unit 84 controls the broadcast recording system 81 to record the instructed broadcast program.

In the broadcast recording system 81, the broadcast receiver 811 receives broadcast wave signals of a broadcast program of which the recording is instructed and supplies the received broadcast signals to a decoder 812. In this example, a video signal V1 and an audio signal A1 are decoded from the received signal and are output by the decoder 812. Here, the audio signal A1 includes, for example, the left and right channel audio signals.

The video signal V1 and the audio signal A1 from the decoder 812 are encoded by a recoding encoder 813 and are recorded on a recording medium 816 by a writer 815. For example, a hard disk device is used as the recording medium 816.

In this example, the operation unit 85 is provided with a key for specifying broadcast program contents recorded on the recording medium 816 and a key for instructing the generation of a level correction gain. When a user specifies the recorded broadcast program contents and operates the key for instructing the generation of the level correction gain, the control unit 84 performs a level correction gain generating process to properly adjust the reproducing sound volume of the audio signals of the specified broadcast program contents.

That is, the control unit 84 controls a reader 821, a reproducing decoder 822, a level correction gain generator 83, and a writer 815 on the basis of the operation input of the key for instructing the generation of the level correction gain.

The control unit 84 controls the reader 821 to read the recorded signals of the specified broadcast program from the recording medium 816. The reader 821 supplies the read recorded signals to the reproducing decoder 822. The reproducing decoder 822 decodes the recorded signals and outputs a reproducing video signal V2 and a reproducing audio signal A2.

The reproducing audio signal A2 from the reproducing decoder 822 is supplied to the level correction gain generator 83. The level correction gain generator 83 generates a gain control signal as described in the first embodiment or the second embodiment.

The level correction gain generator 83 supplies the generated gain control signal to the writer 815. The writer 815 records the gain control signal from the level correction gain generator 83 on the recording medium 816 to be correlated with the recorded signals in reproduction under the control of the control unit 84.

When a user gives a reproduction instruction by the use of the operation unit 85, the control unit 84 controls the reproduction system 82 to reproduce the broadcast program of which the reproduction is instructed.

That is, the control unit 84 controls the reader 821 to read the recorded signal of the specified broadcast program and the gain control signal correlated therewith from the recording medium 816. The reader 821 supplies the read recorded signals to the decoder 822 and supplies the read gain control signal to the gain control signal reproducing unit 826.

The reproducing decoder 822 decodes the recorded signal and acquires the reproducing video signal V2 and the reproducing audio signal A2. The reproducing video signal V2 is output from a video output stage 827 via a video signal processor 823. A display unit is connected to the output stage 827 and a reproduced video of the broadcast program is displayed on the display screen thereof.

The reproducing audio signal from the reproducing decoder 822 is supplied to a variable gain amplifier 825 via an audio signal processor 824.

On the other hand, the gain control signal reproducing unit 826 reproduces the gain control signal from the signal from the reader 821. The gain control signal reproducing unit 826 supplies the reproduced gain control signal to the variable gain amplifier 825, whereby the gain is controlled. Therefore, similarly to the first embodiment and the second embodiment, the audio signal acquired from the variable gain amplifier 825 is audible in voice and the volume of the non-voice sound does not increase.

The reproducing audio signal from the variable gain amplifier 825 is supplied to a speaker via an audio output stage 828.

In the example shown in FIG. 23, the level correction gain generator 83 has the same configuration as the first embodiment or the second embodiment. However, in the example shown in FIG. 23, since it is not necessary to perform a real-time process, the processing time increases but the degree of precision is enhanced.

For example, when the recording and reproducing apparatus 80 has sufficient buffer capacity and processing capability, the interval including a human voice may be detected by detecting the pitch while taking the auto-correlation of the audio signal. By performing a spectrum envelope cepstrum analysis using an FFT (Fast Fourier Transform), the main voice signal including human voice may be detected with higher precision.

In the above-mentioned examples, the audio signal includes left and right channel audio signals. However, the audio signal of which the sound volume should be corrected may be a monaural audio signal, because the input signal of the voice average level detector 22 or the non-voice average level detector 24 is the added audio signal Sm.

The audio signals may be multi channels of three or more channels such as 5.1 channel surround audio signals. In the multi channels, when a center channel exists, the voice signals are mainly included in the center channel and thus the voice interval can be detected from the audio signal of the center channel.

Figure 24:
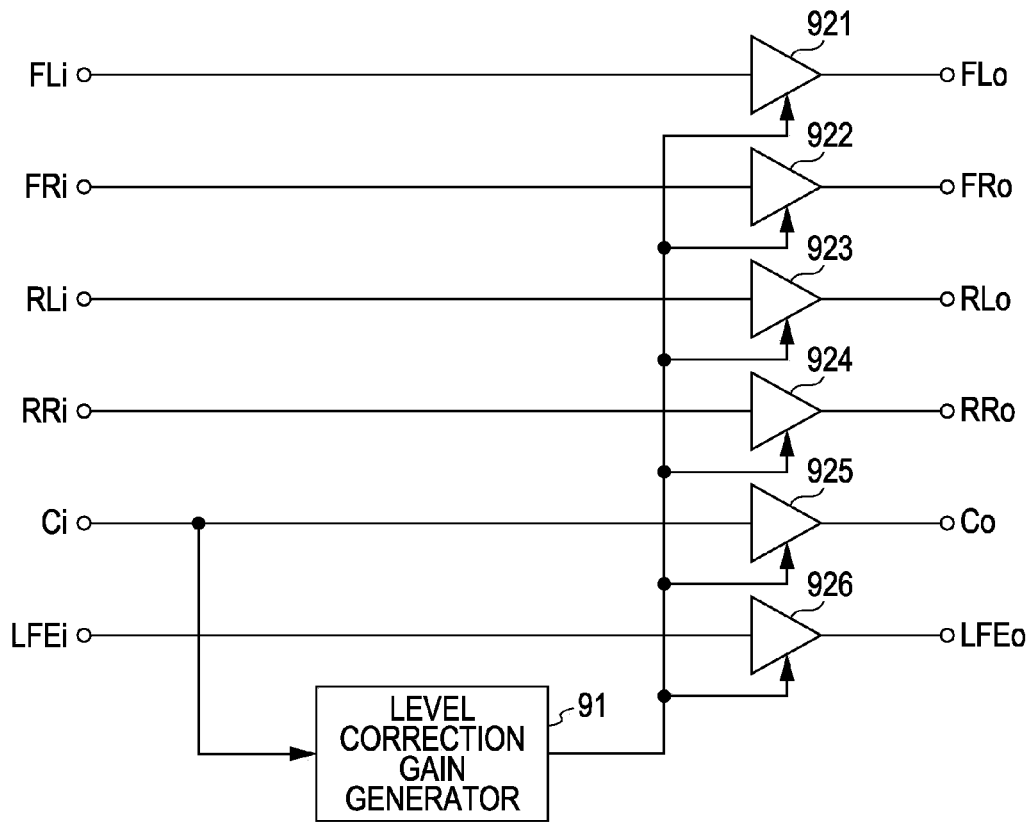
FIG. 24 is a block diagram illustrating a sound volume correcting device according to another embodiment of the invention.

FIG. 24 is a diagram schematically illustrating the configuration of a sound volume correcting device when an input audio signal is a 5.1 channel surround audio signal.

In this example, front left and right channel audio signals FLi and FRi are supplied to variable gain amplifiers 921 and 922. Rear left and right channel audio signals RLi and RRi are supplied to variable gain amplifiers 923 and 924. A center channel audio signal Ci is supplied to a variable gain amplifier 925. A low-band audio signal LFE (Low Frequency Effect) is supplied to a variable gain amplifier 926.

The center channel audio signal Ci is supplied to a voice level correction gain generator 91. The voice level correction gain generator 91 has the same configuration as the voice level correction gain generator 83 shown in FIG. 23. However, the level correction gain generator 91 generates a gain control signal for controlling the gain of the variable gain amplifiers 921 to 926 by the use of one of the above-mentioned methods using the center channel audio signal Ci as the added audio signal Sm in this example.

The audio signals FLo, FRo, RLo, RRo, Co, and LFo are acquired from the variable gain amplifiers 921 to 926 and are output from speakers thereof.

In the example shown in FIG. 24, since the 5.1 channel output audio signals FLo, FRo, RLo, RRo, Co, and LFo are controlled in gain using the gain control signal generated by the level correction gain generator 91, the human voice is audible and the volume of the non-voice sound does not increase.

When the multi channel audio signals of three or more channels are mixed down into the audio signals of two channels and are considered as the signals of two channels, the level correction gain generator can be provided for only the down-mixed two channel audio signals.

Figure 25:
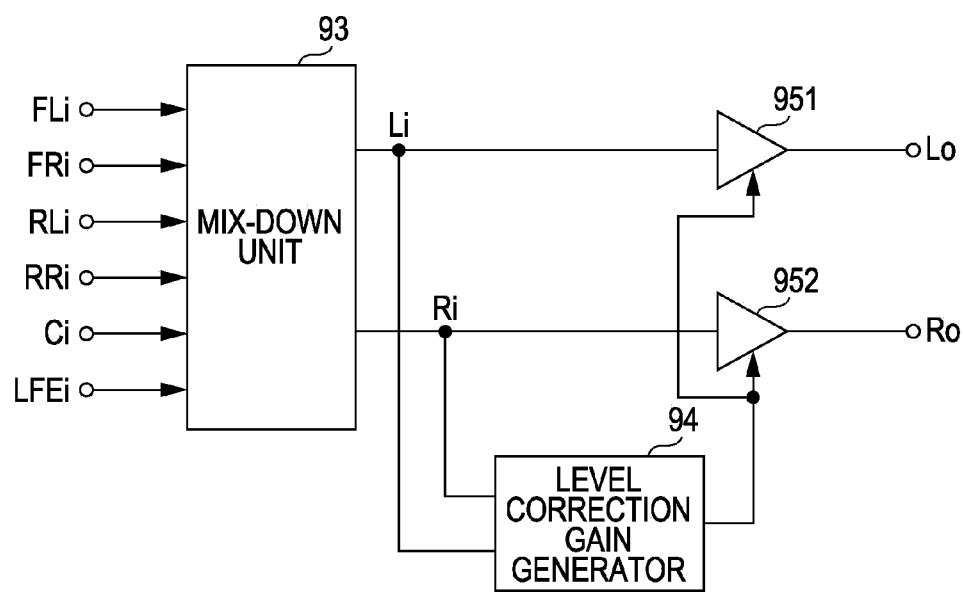
FIG. 25 is a block diagram illustrating a sound volume correcting device according to another embodiment of the invention.
Figure 26:
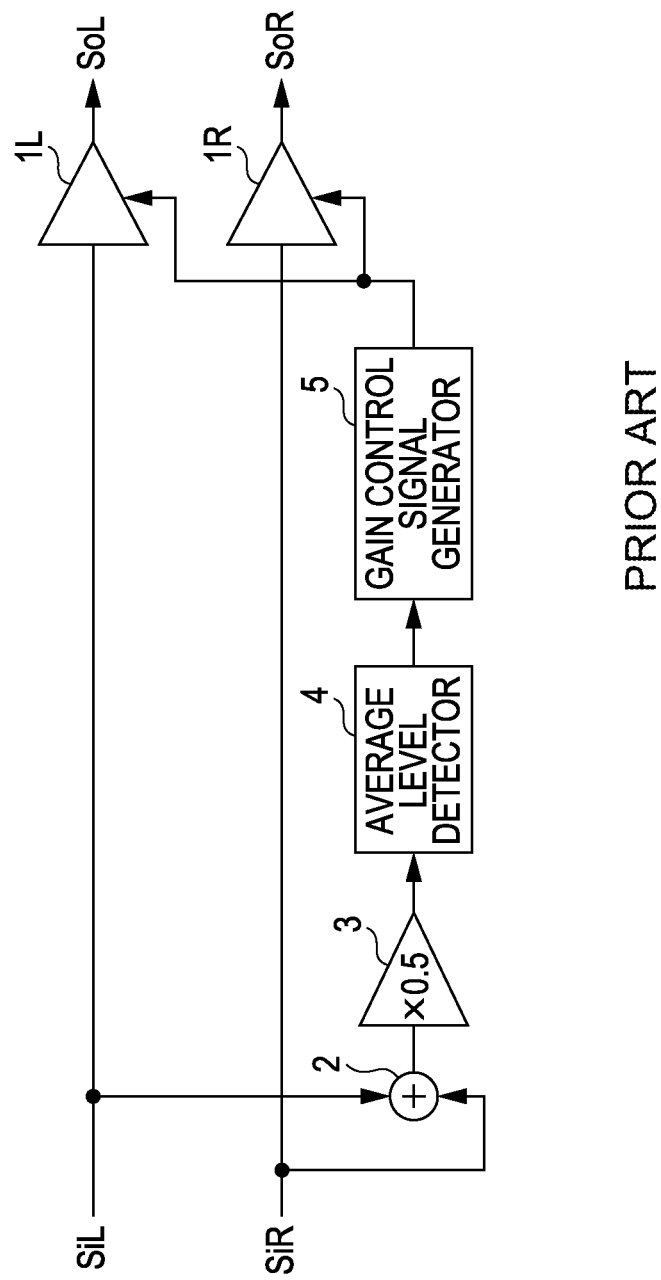
FIG. 26 is a block diagram illustrating a related sound volume correcting device in the past.

FIG. 25 is a diagram schematically illustrating the configuration of a sound volume correcting device when the 5.1 channel surround audio signals are mixed down into two channels.

In the example shown in FIG. 25, the 5.1 channel surround audio signals FLi, Fri, RLi, RRi, Ci, and LFi are supplied to a mix-down unit 93 and are mixed down into left and right channel audio signals Li and Ri.

The left and right channel audio signals Li and Ri from the mix-down unit 93 are supplied to variable gain amplifiers 951 and 952 and are also supplied to a level correction gain generator 94.

The level correction gain generator 93 has the same configuration as the level correction gain generator 83 shown in FIG. 23. That is, the level correction gain generator 93 of this example generates gain control signals for controlling the gains of the variable gain amplifiers 951 and 952 from the left and right channel audio signals Li and Ri by the use of any one of the above-mentioned methods.

The example shown in FIG. 25 has the same operational advantages as described above.

Other Modified Examples

In the above description, the voice level average detector 22 and the non-voice level average detector 24 are constructed by hardware such as discrete circuit portions. However, they may be constructed by a DSP (Digital Signal Processor).

The voice level average detector 22 and the non-voice level average detector 24 may be constructed by software such as computer programs. In this case, in the example shown in FIG. 2, the voice level average detector 22 and the non-voice level average detector 24 are provided as software processing functions to the control unit 10. As indicated by the dotted line in FIG. 2, the gain of the variable gain amplifier of the sound volume corrector 18 is controlled on the basis of the gain control signal from the control unit 10.

When an audio signal is processed by a digital signal processing method, all the units of the sound volume corrector 18 including the variable gain amplifier may be embodied by software.

The electronic apparatus employing the sound volume correcting device according to the embodiments of the invention is not limited to the television broadcast receiver shown in FIG. 2.

The present application contains subject matter related to that disclosed in Japanese Priority Patent Application JP 2008-309704 filed in the Japan Patent Office on Dec. 4, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A sound volume correcting device comprising:
   a variable gain device configured to control a gain of an input audio signal based at least in part on a gain control signal;
   a voice average level detecting device configured to detect an average level of a human voice signal in the input audio signal, wherein the voice average level detecting device includes:
      a voice interval detecting device configured to detect a voice interval which is a time interval including the human voice signal in the input audio signal, wherein the voice interval detecting device includes:
         a peak period detecting device configured to detect an inter-peak period of the input audio signal;
         a continuous identical period detecting device configured to detect a continuous identical period by detecting the identity of the adjacent inter-peak periods using the inter-peak period detected by the peak period detecting device; and
         a frequency detecting device configured to detect as the voice interval an interval including the continuous identical period detected by the continuous identical period detecting device or to detect as the voice interval a time interval in which the frequency of the continuous identical period is equal to or greater than a reference value; and
      a voice average level generating device configured to detect the average level of the input audio signal in the voice interval detected by the voice interval detecting device and to generate a continuous average level in which the detected average level of the voice interval is continuous; and
   a gain control signal generating device configured to generate the gain control signal for controlling the gain of the input audio signal using the average level of the human voice signal detected by the voice average level detecting device as a reference level and to supply the generated gain control signal to the variable gain device, wherein the gain control signal generating device generates the gain control signal for controlling the gain of the input audio signal using the continuous average level as the reference level.

2. A sound volume correcting device comprising:
   a variable gain device configured to control a gain of an input audio signal based at least in part on a gain control signal;
   a voice average level detecting device configured to detect an average level of a human voice signal in the input audio signal, wherein the voice average level detecting device includes:
      a voice interval detecting device configured to detect a voice interval which is a time interval including the human voice signal in the input audio signal, wherein the voice interval detecting device includes:
         a first filter configured to extract a first audio signal including a voice frequency band from the input audio signal;
         a first average level detecting device configured to detect the average level of the first audio signal from the first filter;
         a second filter configured to extract a second audio signal not including the voice frequency band from the input audio signal;

a second average level detecting device configured to detect the average level of the second audio signal from the second filter; and a comparing device configured to detect as the voice interval a time interval in which the difference or ratio of the average level detected by the first average level detecting device and the average level detected by the second average level detecting device is equal to or greater than a reference value; and a voice average level generating device configured to detect the average level of the input audio signal in the voice interval detected by the voice interval detecting device and to generate a continuous average level in which the detected average level of the voice interval is continuous; and a gain control signal generating device configured to generate the gain control signal for controlling the gain of the input audio signal using the average level of the human voice signal detected by the voice average level detecting device as a reference level and to supply the generated gain control signal to the variable gain device, wherein the gain control signal generating device generates the gain control signal for controlling the gain of the input audio signal using the continuous average level as the reference level.

3. A sound volume correcting device comprising:

a variable gain device configured to control a gain of an input audio signal based at least in part on a gain control signal, wherein the input audio signal is two-channel audio signals;

a voice average level detecting device configured to detect an average level of a human voice signal in the input audio signal, wherein the voice average level detecting device includes:

a voice interval detecting device configured to detect a voice interval which is a time interval including the human voice signal in the input audio signal, wherein the voice interval detecting device includes a center orientation detecting device configured to detect as the voice interval a time interval in which a center orientation distribution from the two-channel audio signals is equal to or greater than a reference value; and a voice average level generating device configured to detect the average level of the input audio signal in the voice interval detected by the voice interval detecting device and to generate a continuous average level in which the detected average level of the voice interval is continuous; and a gain control signal generating device configured to generate the gain control signal for controlling the gain of the input audio signal using the average level of the human voice signal detected by the voice average level detecting device as a reference level and to supply the generated gain control signal to the variable gain device, wherein the gain control signal generating device generates the gain control signal for controlling the gain of the input audio signal using the continuous average level as the reference level.

4. A sound volume correcting device comprising:

a variable gain device configured to control a gain of an input audio signal based at least in part on a gain control signal;

a voice average level detecting device configured to detect an average level of a human voice signal in the input audio signal, wherein the voice average level detecting device includes:

a voice interval detecting device configured to detect a voice interval which is a time interval including the human voice signal in the input audio signal, wherein the voice interval detecting device comprises any one or a combination of two or more of a device selected from the group consisting of:

a peak period detecting device configured to detect an inter-peak period of the input audio signal, a continuous identical period detecting device configured to detect a continuous identical period by detecting the identity of the adjacent inter-peak periods using the inter-peak period detected by the peak period detecting device, and a frequency detecting device configured to detect as the voice interval an interval including the continuous identical period detected by the continuous identical period detecting device or to detect as the voice interval a time interval in which the frequency of the continuous identical period is equal to or greater than a reference value;

a first filter configured to extract a first audio signal including a voice frequency band from the input audio signal, a first average level detecting device configured to detect the average level of the first audio signal from the first filter, a second filter configured to extract a second audio signal not including the voice frequency band from the input audio signal, a second average level detecting device configured to detect the average level of the second audio signal from the second filter, and a comparing device configured to detect as the voice interval a time interval in which the difference or ratio of the average level detected by the first average level detecting device and the average level detected by the second average level detecting device is equal to or greater than a reference value; and a center orientation detecting device configured to detect as the voice interval a time interval in which a center orientation distribution from the two-channel audio signals is equal to or greater than a reference value when the input audio signal is two-channel audio signals; and a voice average level generating device configured to detect the average level of the input audio signal in the voice interval detected by the voice interval detecting device and to generate a continuous average level in which the detected average level of the voice interval is continuous; and a gain control signal generating device configured to generate the gain control signal for controlling the gain of the input audio signal using the average level of the human voice signal detected by the voice average level detecting device as a reference level and to supply the generated gain control signal to the variable gain device, wherein the gain control signal generating device generates the gain control signal for controlling the gain of the input audio signal using the continuous average level as the reference level.

5. A sound volume correcting device comprising:

a variable gain device configured to control a gain of an input audio signal based at least in part on a gain control signal;

a voice average level detecting device configured to detect an average level of a human voice signal in the input audio signal;

a non-voice average level detecting device configured to detect an average level of a non-voice and non-silence audio signal in the input audio signal; and a gain control signal generating device configured to generate the gain control signal for controlling the gain of the input audio signal using the voice average level detected by the voice average level detecting device as a reference level when the non-voice average level detected by the non-voice average level detecting device is not greater than the voice average level detected by the voice average level detecting device by a predetermined amount, to generate the gain control signal for controlling the gain of the input audio signal using the non-voice average level detected by the non-voice average level detecting device as a reference level when the non-voice average level detected by the non-voice average level detecting device is greater than the voice average level detected by the voice average level detecting device by the predetermined amount, and to supply the generated gain control signal to the variable gain device.

6. A sound volume correcting method of a sound volume correcting device having a variable gain device for controlling a gain of an input audio signal on the basis of a gain control signal, a voice average level detecting device, and a gain control signal generating device, the sound volume correcting method comprising:

detecting, using the voice average level device, an average level of a human voice signal in the input audio signal by detecting a voice interval which is a time interval including the human voice signal in the input audio signal, wherein detecting a voice interval comprises:

detecting an inter-peak period of the input audio signal;

detecting a continuous identical period by detecting the identity of the adjacent inter-peak periods using the inter-peak period detected by the peak period detecting device; and detecting as the voice interval an interval including the continuous identical period detected by the continuous identical period detecting device or detecting as the voice interval a time interval in which the frequency of the continuous identical period is equal to or greater than a reference value; and generating, using the gain control signal generating device, the gain control signal for controlling the gain of the input audio signal using the average level of the detected human voice signal as a reference level, wherein the variable gain device is controlled based at least in part on the generated gain control signal.

7. A sound volume correcting method of a sound volume correcting device having a variable gain device for controlling a gain of an input audio signal on the basis of a gain control signal, a voice average level detecting device, a non-voice average level detecting device, and a gain control signal generating device, the sound volume correcting method comprising:

detecting, using the voice average level detecting device, an average level of a human voice signal in the input audio signal;

detecting, using the non-voice average level detecting device, an average level of a non-voice and non-silence audio signal in the input audio signal; and generating, using the gain control signal generating device, the gain control signal for controlling the gain of the input audio signal using the detected voice average level as a reference level when the detected non-voice average level is not greater than the detected voice average level by a predetermined amount and to generate the gain control signal for controlling the gain of the input audio signal using the detected non-voice average level as a reference level when the detected non-voice average level is greater than the detected voice average level by the predetermined amount, wherein the variable gain device is controlled based at least in part on the generated gain control signal.

8. An electronic apparatus having a sound volume correcting device comprising:

a variable gain device configured to control a gain of an input audio signal based at least in part on a gain control signal;

a voice average level detector configured to detect an average level of a human voice signal in the input audio signal;

a non-voice average level detector configured to detect an average level of a non-voice and a non-silence audio signal in the input audio signal; and a gain control signal generator configured to generate the gain control signal for controlling the gain of the input audio signal using the voice average level detected by the voice average level detector as a reference level when the non-voice average level detected by the non-voice average level detector is not greater than the voice average level detected by the voice average level detector by a predetermined amount, to generate the gain control signal for controlling the gain of the input audio signal using the non-voice average level detected by the non-voice average level detector as a reference level when the non-voice average level detected by the non-voice average level detector is greater than the voice average level detected by the voice average level detector by the predetermined amount, and to supply the generated gain control signal to the variable gain device.

\* \* \* \* \*